(12) United States Patent
Song

(10) Patent No.: US 9,099,637 B2
(45) Date of Patent: Aug. 4, 2015

(54) PHASE CHANGE MEMORY AND METHOD OF FABRICATING THE PHASE CHANGE MEMORY

(71) Applicant: Intellectual Discovery Co., Ltd., Seoul (KR)

(72) Inventor: Yun Heub Song, Seongnam-si (KR)

(73) Assignee: INTELLECTUAL DISCOVERY CO., LTD., Seoul (KR)

( * ) Notice: Subject to any disclaimer, the term of this patent is extended or adjusted under 35 U.S.C. 154(b) by 0 days.

(21) Appl. No.: 14/228,765

(22) Filed: Mar. 28, 2014

(65) Prior Publication Data

US 2014/0291603 A1    Oct. 2, 2014

(30) Foreign Application Priority Data

Mar. 28, 2013  (KR) .................. 10-2013-0033663
Mar. 28, 2013  (KR) .................. 10-2013-0033665
Mar. 28, 2013  (KR) .................. 10-2013-0033666

(51) Int. Cl.
*H01L 45/00*    (2006.01)
*H01L 27/24*    (2006.01)

(52) U.S. Cl.
CPC ............. *H01L 45/06* (2013.01); *H01L 27/249* (2013.01); *H01L 45/1226* (2013.01); *H01L 45/145* (2013.01); *H01L 45/1616* (2013.01); *H01L 45/1675* (2013.01)

(58) Field of Classification Search
CPC ... H01L 45/06; H01L 45/065; H01L 45/1233; H01L 45/1616; H01L 45/1226; H01L 45/1675; H01L 45/145
USPC ........................................... 257/2, 4
See application file for complete search history.

(56) References Cited

U.S. PATENT DOCUMENTS

| | | | | |
|---|---|---|---|---|
| 6,545,287 B2* | 4/2003 | Chiang | ............................. | 257/3 |
| 6,764,894 B2* | 7/2004 | Lowrey | .......................... | 438/238 |
| 7,829,878 B2* | 11/2010 | Sato | .................................. | 257/4 |
| 8,765,555 B2* | 7/2014 | Van Gerpen | .................. | 438/270 |
| 2005/0104231 A1* | 5/2005 | Chiang et al. | ................. | 257/798 |
| 2007/0138467 A1* | 6/2007 | Chiang et al. | ..................... | 257/55 |
| 2010/0078622 A1* | 4/2010 | Yoshimizu et al. | ............... | 257/4 |
| 2011/0057162 A1* | 3/2011 | Breitwisch et al. | ............... | 257/3 |
| 2013/0285003 A1* | 10/2013 | Van Gerpen | ...................... | 257/4 |
| 2014/0061574 A1* | 3/2014 | Pio | .................................... | 257/5 |

* cited by examiner

Primary Examiner — Allan R Wilson
(74) Attorney, Agent, or Firm — Rabin & Berdo, P.C.

(57) ABSTRACT

Provided is a phase change memory, including: at least one wiring layer each including a first conductive layer and a phase change layer horizontally disposed on the first conductive layer; a heater layer disposed to vertically contact with the at least one wiring layer; and a second conductive layer disposed to contact with the heater layer in parallel therewith, and through which current flows from at least one electrode into the at least one wiring layer. The phase change layer may be made of a phase change material and may have a thickness less than a thickness of the first conductive layer.

5 Claims, 22 Drawing Sheets

PHASE CHANGE MEMORY AND METHOD OF FABRICATING THE PHASE CHANGE MEMORY

CROSS-REFERENCE TO RELATED APPLICATIONS

This application claims the priority benefit of Korean Patent Application Nos. 10-2013-0033663, 10-2013-0033665, and 10-2013-0033666, filed on Mar. 28, 2013, in the Korean Intellectual Property Office, the disclosures of which are incorporated herein by reference.

BACKGROUND

1. Field of the Invention

Embodiments of the present invention relate to a phase change memory using a phase change material and a method of fabricating the phase change memory.

2. Description of the Related Art

Currently, various types of three-dimensional (3D) memory devices have been proposed to overcome limitations in two-dimensional (2D) scaling of a NAND flash memory. A 3D NAND flash memory may be provided in, for example, a built-in current sensor (BICS) structure and a bit cost scalable (BiCS) NAND flash cell structure of a piped type that is enhanced from the BICS structure.

A 3D NAND flash memory in the BICS structure uses an oxide-nitride-oxide (ONO) layer as storage and a structure using a trap of a nitride layer may degrade the reliability. Accordingly, research on enhancing the reliability has been continuously conducted.

Also, a 3D NAND flash memory structurally uses an ONO structure as a storage site within a vertical poly silicon channel on a scaling phase. Accordingly, a contact size for a vertical channel is determined based on a thickness of an ONO layer and at least 50 nm needs to be secured when the thickness of the ONO layer is to be 10 nm to 20 nm.

Currently, research on securing a characteristic of a NAND flash structure by applying a resistive memory device, for example, phase change RAM (PRAM) or resistive RAM (ReRAM) to the above 3D structure is ongoing. The resistive memory device may easily configure a cross-point compared to an ONO layer and may also easily perform scaling compared to the ONO layer when configuring a vertical channel or a gate. However, the 3D structure using a resistive change material, for example, PRAM or ReRAM, needs to be enhanced in order to secure the enhanced reliability.

In the existing 3D structure, vertical scaling is difficult and it is difficult to maintain a size of a contact hole of a vertical channel or a gate electrode to be less than or equal to 40 nm due to limitations on a storage thickness. Accordingly, multiple layers including 100 layers or more are required to achieve the same level of integration as a 2D 1xnm class.

In a 3D flash memory structure using a general phase change material, a phase change material may contact with a horizontally formed conductive layer by vertically forming the phase change material on a sidewall of a contact hole. However, due to resistance of the conductive layer, it is difficult to decrease the contact size to be less than or equal to 20 nm. In addition, a memory phase change material and a heater layer are formed within the contact hole and thus, scaling is difficult compared to a structure using an ONO layer.

A general 3D flash memory uses an ONO storage film in a vertical direction within a contact hole. In this structure, charge storage areas are not separated between cells and thus, inter-cell interference may increase, which may lead to making it difficult to apply a multi-level cell (MLC). Also, in the general 3D flash memory structure, a resistive change layer is vertically formed within the contact hole and is connected to a horizontally formed conductive layer. Accordingly, the resistance change layer is not separated between cells and a single resistance change layer is used and thus, the reliability may be degraded in view of a technical aspect for MLC.

SUMMARY

Embodiments of the present invention provide a three-dimensional (3D) NAND flash memory device structure in which a phase change material is formed.

Embodiments of the present invention also provide a relatively thin wiring layer by horizontally disposing a phase change material on a conductive layer using an atomic layer deposition (ALD) method.

Embodiments of the present invention also provide a 3D flash memory having a decreased driving current density.

Embodiments of the present invention also provide a structure that uses a multilayered structure of a phase change layer and a conductive layer as a horizontal wiring layer when configuring a 3D NAND flash memory using a phase change memory.

Embodiments of the present invention also provide a 3D NAND flash memory structure that may easily perform scaling by forming a memory material within a contact hole.

Embodiments of the present invention also provide a multi-level bit/cell operation based on an etch rate of a side surface of a horizontally formed conductive layer.

According to an aspect of the present invention, there is provided a phase change memory, including: at least one wiring layer, each including a first conductive layer and a phase change layer horizontally disposed on the first conductive layer; a heater layer disposed to vertically contact with the at least one wiring layer; and a second conductive layer disposed to contact with the heater layer in parallel therewith, and through which current flows from at least one electrode into the at least one wiring layer. The phase change layer may be made of a phase change material and may have a thickness less than a thickness of the first conductive layer.

The phase change layer may be horizontally disposed on the first conductive layer using an atomic layer deposition (ALD) method.

The phase change layer may be formed to have a thickness of 1 nm or less.

The at least one wiring layer may be separated from each other by at least one insulating layer disposed between the at least one wiring layer.

The phase change layer may have a phase change in a portion vertically contacting with the heater layer.

The phase change memory may further include an insulator formed in a space formed by etching a portion of the first conductive layer.

The insulator may be formed on a portion in which the heater layer contacts with the corresponding wiring layer.

In the at least one wiring layer, a wiring layer disposed in a lower portion may have a relatively wide area compared to a wiring layer disposed in an upper portion.

The phase change memory may further include at least one lower electrode connected to the at least one wiring layer, and an upper electrode connected to the second conductive layer.

According to another aspect of the present invention, there is provided a phase change memory, including: at least one wiring layer each including a first conductive layer and at least two phase change layers horizontally disposed on a bottom surface of the first conductive layer; at least one insulating layer horizontally disposed on a top surface of the at least one wiring layer; a lower electrode connected to a top surface of the first conductive layer through a space formed by vertically etching a portion of the at least one insulating layer; a heater layer disposed to vertically contact with the at least one wiring layer; and a second conductive layer disposed to contact with the heater layer in parallel therewith, and through which current flows from at least one electrode into the at least one wiring layer.

The at least two phase change layers may be made of a phase change material having a thickness less than a thickness of the first conductive layer, and may be horizontally disposed on the first conductive layer using an ALD method.

The at least one wiring layer may be separated from each other by at least one insulating layer.

The at least two phase change layers may have a phase change at a portion vertically contacting with the heater layer.

The phase change memory may further include an insulator formed in a space formed by etching a portion of the first conductive layer.

The insulator may be formed on a portion in which the heater layer contacts with the corresponding wiring layer.

In the at least one wiring layer, a wiring layer disposed in a lower portion may have a relatively wide area compared to a wiring layer disposed in an upper portion.

The phase change memory may further include an upper electrode connected to the second conductive layer.

The at least two phase change layers may be made of different phase change materials.

According to still another aspect of the present invention, there is provided a phase change memory, including: at least one wiring layer each including a first conductive layer and at least two phase change layers horizontally disposed on a top surface of the first conductive layer; at least one insulating layer horizontally disposed on a top surface of the at least one wiring layer; a lower electrode connected to the top surface of the first conductive layer exposed by etching a portion of the at least two phase change layers through a space formed by vertically etching a portion of the at least one insulating layer; a heater layer disposed to vertically contact with the at least one wiring layer; and a second conductive layer disposed to contact with the heater layer in parallel therewith, and through which current flows from at least one electrode into the at least one wiring layer.

According to still another aspect of the present invention, there is provided a phase change memory, including: at least one wiring layer each including a first conductive layer, at least one first phase change layer horizontally disposed on a top surface of the first conductive layer, and at least one second phase change layer horizontally disposed on a bottom surface of the first conductive layer; at least one insulating layer horizontally disposed on a top surface of the at least one wiring layer; a lower electrode connected to the top surface of the first conductive layer exposed by etching a portion of the at least one first phase change layer through a space formed by vertically etching a portion of the at least one insulating layer; a heater layer disposed to vertically contact with the at least one wiring layer; and a second conductive layer disposed to contact with the heater layer in parallel therewith, and through which current flows from at least one electrode into the at least one wiring layer.

According to still aspect of the present invention, there is provided a phase change memory, including: at least one wiring layer each including a first conductive layer and a phase change layer horizontally disposed on the first conductive layer; an insulator filled in a space formed by etching a portion of the first conducive layer; a heater layer disposed to vertically contact with the at least one wiring layer; and a second conductive layer disposed to contact with the heater layer in parallel therewith, and through which current flows from at least one electrode into the at least one wiring layer. A multi-level bit/cell operation may be performed based on an etch rate of the first conductive layer.

An amount of current passing through the second conductive layer may vary based on a crystallization state of the phase change layer.

The phase change layer may be made of a phase change material having a thickness less than a thickness of the first conductive layer and may be horizontally disposed on the first conductive layer using an ALD method.

The at least one wiring layer may be separated from each other by at least one insulating layer disposed between the at least one wiring layer.

The phase change layer may have a phase change in a portion vertically contacting with the heater layer.

The insulator may be formed on a portion in which the heater layer contacts with the corresponding wiring layer.

The phase change memory may further include at least one lower electrode connected to the at least one wiring layer; and an upper electrode connected to the second conductive layer.

According to still aspect of the present invention, there is provided a method of fabricating a phase change memory, the method including: forming at least one wiring layer by horizontally disposing a phase change layer on a first conductive layer; forming a heater layer disposed to vertically contact with the at least one wiring layer; and forming a second conducive layer disposed to contact with the heater layer in parallel therewith, and through which current flows from at least one electrode into the at least one wiring layer. The phase change layer may be made of a phase change material and may have a thickness less than a thickness of the first conductive layer.

According to still aspect of the present invention, there is provided a method of fabricating a phase change memory, the method including: forming at least one wiring layer each including a first conductive layer and at least two phase change layers horizontally disposed on a bottom surface of the first conductive layer; horizontally disposing at least one insulating layer on a top surface of the at least one wiring layer; connecting a lower electrode to a top surface of the first conductive layer through a space formed by vertically etching a portion of the at least one insulating layer; forming a heater layer disposed to vertically contact with the at least one wiring layer; and forming a second conductive layer disposed to contact with the heater layer in parallel therewith, and through which current flows from at least one electrode into the at least one wiring layer.

According to still aspect of the present invention, there is provided a method of fabricating a phase change memory, the method including: forming at least one wiring layer each including a first conductive layer and at least two phase change layers horizontally disposed on a top surface of the first conductive layer; horizontally disposing at least one insulating layer on a top surface of the at least one wiring layer; connecting a lower electrode to the top surface of the first conductive layer exposed by etching a portion of the at least two phase change layers through a space formed by vertically etching a portion of the at least one insulating layer; forming a heater layer disposed to vertically contact with the at least one wiring layer; and forming a second conductive layer disposed to contact with the heater layer in parallel therewith, and through which current flows from at least one electrode into the at least one wiring layer.

According to still aspect of the present invention, there is provided a method of fabricating a phase change memory, the method including: forming at least one wiring layer each including a first conductive layer, at least one first phase change layer horizontally disposed on a top surface of the first conductive layer, and at least one second phase change layer horizontally disposed on a bottom surface of the first conductive layer; horizontally disposing at least one insulating layer on a top surface of the at least one wiring layer; connecting a lower electrode to the top surface of the first conductive layer exposed by etching a portion of the at least one first phase change layer through a space formed by vertically etching a portion of the at least one insulating layer; forming a heater layer disposed to vertically contact with the at least one wiring layer; and forming a second conductive layer disposed to contact with the heater layer in parallel therewith, and through which current flows from at least one electrode into the at least one wiring layer.

According to still aspect of the present invention, there is provided a method of fabricating a phase change memory, the method including: forming at least one wiring layer each including a first conductive layer and a phase change layer horizontally disposed on the first conductive layer; filling an insulator in a space formed by etching a portion of the first conducive layer; forming a heater layer disposed to vertically contact with the at least one wiring layer; and forming a second conductive layer disposed to contact with the heater layer in parallel therewith, and through which current flows from at least one electrode into the at least one wiring layer. A multi-level bit/cell operation may be performed based on an etch rate of the first conductive layer.

Effects

According to embodiments of the present invention, it is possible to a three-dimensional (3D) NAND flash memory device structure in which a phase change material is formed.

Also, according to embodiments of the present invention, it is possible to provide a relatively thin wiring layer by horizontally disposing a phase change material on a conductive to layer using an atomic layer deposition (ALD) method.

Also, according to embodiments of the present invention, it is possible to provide a 3D flash memory having a decreased driving current density.

Also, according to embodiments of the present invention, it is possible to provide a structure that uses a multilayered structure of a phase change layer and a conductive layer as a horizontal wiring layer when configuring a 3D NAND flash memory using a phase change memory.

Also, according to embodiments of the present invention, it is possible to provide a 3D NAND flash memory structure that may easily perform scaling by forming a memory material within a contact hole.

Also, according to embodiments of the present invention, it is possible to provide a multi-level bit/cell operation based on an etch rate of a side surface of a horizontally formed conductive layer.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION

Figure 1:
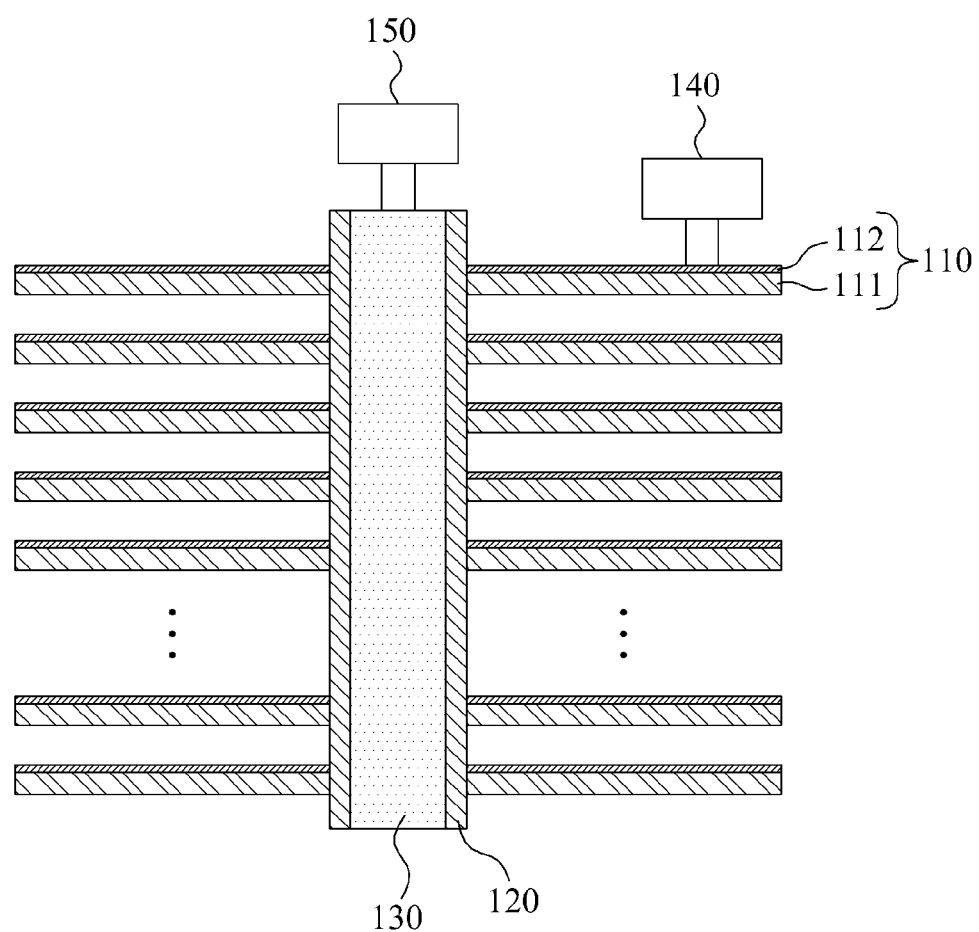
FIG. 1 is a view illustrating a structure of a phase change memory according to an embodiment of the present invention.

Reference will now be made in detail to exemplary embodiments of the present invention, examples of which are illustrated in the accompanying drawings, wherein like reference numerals refer to like elements throughout. Hereinafter, embodiments of the present invention are described with reference to the accompanying drawings, however, are not limited thereto or restricted thereby.

When it is determined that detailed description related to a related known function or configuration they may make the purpose of the present invention unnecessarily ambiguous in describing the present invention, the detailed description will be omitted here. Also, terminologies used herein are defined to appropriately describe the exemplary embodiments of the present invention and thus may be changed depending on a user, the intent of an operator, or a custom. Accordingly, the terminologies must be defined based on the to following overall description of this specification.

FIG. 1 is a view illustrating a structure of a phase change memory according to an embodiment of the present invention.

Referring to FIG. 1, the phase change memory may include at least one wiring layer 110 each including a first conductive layer 111 and a phase change layer 112 horizontally disposed on the first conductive layer 111, a heater layer 120, and a second conductive layer 130.

The heater layer 120 vertically contacts with the at least one wiring layer 110, and the second conductive layer 130 contacts with the heater layer 120 in parallel therewith, and allows current to flow from at least one electrode into the at least one wiring layer 110. In the at least one wiring layer 110, the wiring layer 110 disposed in a lower portion may have a relatively wide area compared to the wiring layer 110 disposed in an upper portion.

The phase change layer 112 may be made of a phase change material and may have a thickness less than a thickness of the first conductive layer 111. For example, the phase change layer 112 may be formed to have a thickness of 1 nm or less. Also, the phase change layer 112 may be horizontally disposed on the first conductive layer 111 using an atomic layer deposition (ALD) method.

The phase change memory may further include at least one lower electrode 140 connected to the at least one wiring layer 110 and an upper electrode 150 connected to the second conductive layer 130.

The phase change memory may outperform a contact area scaling issue coming from limitations in a thickness of a sidewall of a memory structure using an oxide-nitride-oxide (ONO) layer by employing, as a storage material, a phase change material having a contact area corresponding to a thickness of an atomic layer and thus, may decrease a number of vertically stacked, that is, multilayered layers in the same degree of integration.

The phase change memory may form the phase change layer 112 by vertically to disposing a single atomic layer, for example, a single atomic layer of 1 nm or less on a top surface or a bottom surface of the first conductive layer 111 using a phase change material and using an ALD method, and may use the phase change layer 112 as a memory site. The phase change memory may remove a memory storage material within a vertical contact hole and thus, scaling of a contact area is enabled.

According to an aspect, the phase change memory in a three-dimensional (3D) structure may form a phase change contact area using an atomic layer of 1 nm or less and thus, may decrease the phase change contact area to be less than or equal to 1/100 compared to a resistive memory in a two-dimensional (2D) structure.

The phase change memory may be provided in a memory structure capable of preventing short among a horizontally formed wiring, a vertically formed heater layer, and a vertically formed wiring on the phase change contact area corresponding to a cross-point. Referring to FIG. 1, the phase change memory may be provided in a structure including the horizontally formed wiring layer 110, and the vertically formed heater layer 120 and the second conductive layer 130 and thus, current may seamlessly flow between the lower electrode 140 and the upper electrode 150.

Figure 2:
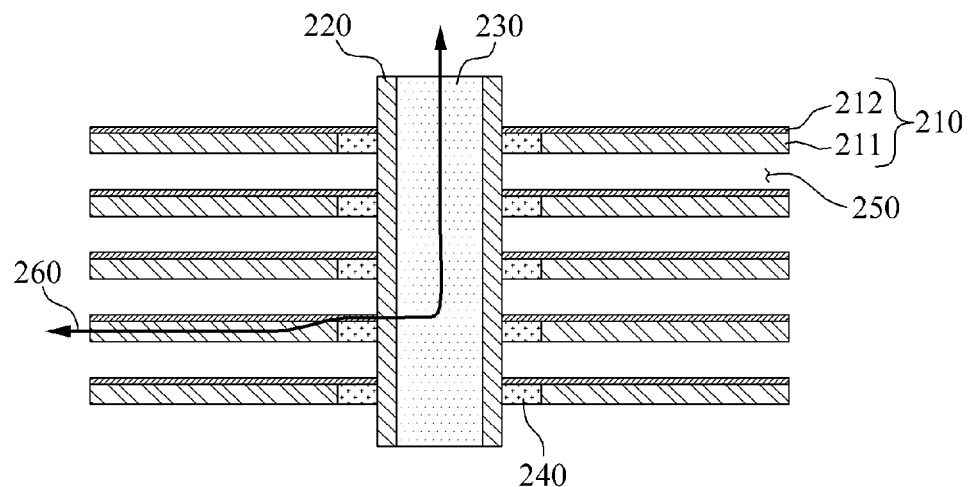
FIG. 2 is a vertical cross-sectional view illustrating a current flow of a phase change memory according to an embodiment of the present invention.

FIG. 2 is a vertical cross-sectional view illustrating a current flow of a phase change memory according to an embodiment of the present invention.

Referring to FIG. 2, a wiring layer 210 of the phase change memory may use an atomic layer with a thickness of 1 nm or less as a contact area of a phase change layer 212 and an insulator 240 may be formed in a space formed by etching a portion of a first conductive layer 211 using a chemical or drying method and thereby form a cross-point architecture. For example, the insulator 240 may be formed on a portion in which a heater layer 220 contacts with the wiring layer 210. At least one wiring layer 210 may be separated from each other by at least one insulating layer 250 disposed between the at least one wiring layer 210.

The phase change memory may have a phase change in a portion in which the horizontally formed phase change layer 212 contacts with the heater layer 220 or a portion close to the heater layer 220. As indicated by a current travel path 260, current may flow between the wiring layer 210 and a second conductive layer 230 based on crystallization of the phase change layer 212. Here, the horizontal phase change layer 212 may secure a significantly thin thickness of 1 nm or less using an ALD method or the like and thus, driving current density may be significantly decreased.

Figure 3:
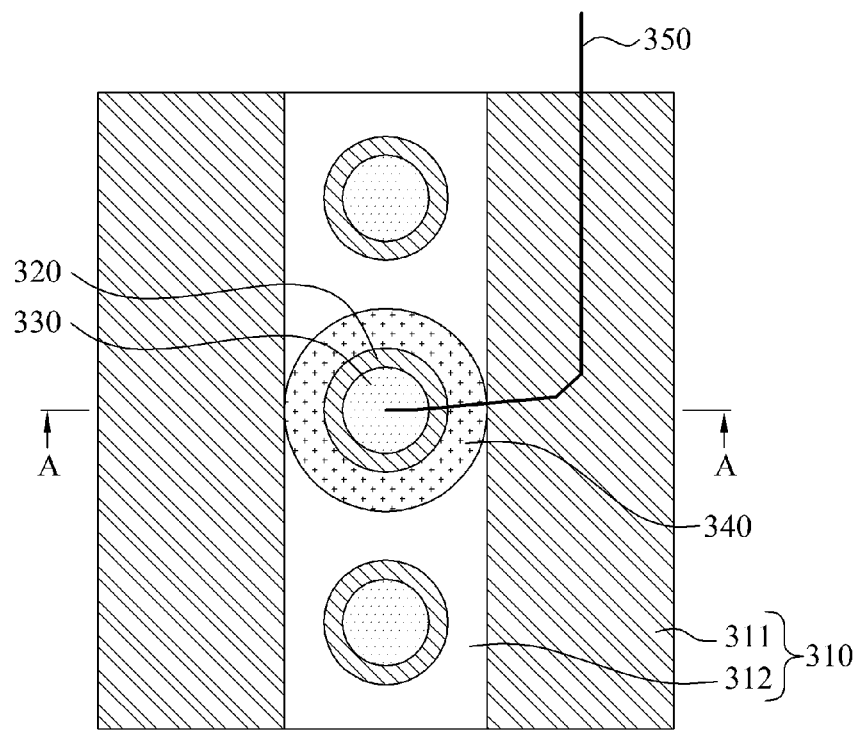
FIG. 3 is a horizontal cross-sectional view of a phase change memory in a three-dimensional (3D) structure.
Figure 4:
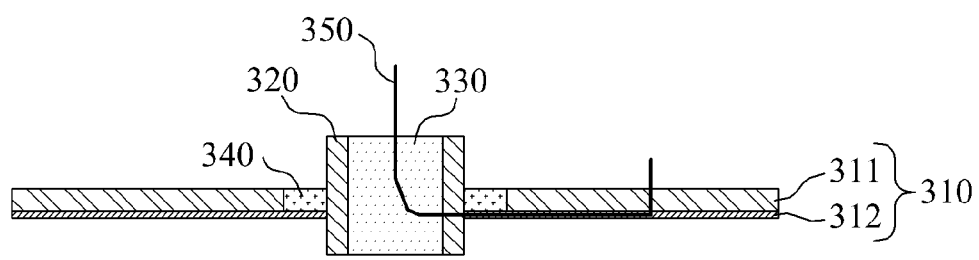
FIG. 4 is a vertical cross-sectional view of a phase change memory in a 3D structure.

FIG. 3 is a horizontal cross-sectional view of a phase change memory in a 3D structure, and FIG. 4 is a vertical cross-sectional view of the phase change memory in the 3D structure.

The phase change memory may be provided in a structure of a 3D NAND flash memory device. Referring to FIGS. 3 and 4, it is possible to significantly decrease driving current density by employing a thickness of a phase change material as a contact area and reducing a thickness of a thin film of a phase change layer 312 using an ALD method. The phase change memory may enhance a degree of integration by utilizing a 3D structure and may secure the reliability at a cross-point.

For example, the phase change memory in the 3D structure may include at least one wiring layer 310 each including a first conductive layer 311 and the phase change layer 312 horizontally disposed on the first conductive layer 31, a heater layer 320 disposed to vertically contact with the at least one wiring layer 320, and a second conductive layer 330 disposed to contact with the heater layer 320 in parallel therewith, and through which current flows from at least one electrode into the at least one wiring layer 310. Here, the phase change memory may form an insulator 340 in a space formed by etching a portion of the first conductive layer 311. In the phase change memory, current may flow between the wiring layer 310 and the second conductive layer 330 according to crystallization of the phase change layer 312 as indicated by a current travel path 350.

FIGS. 5 through 9 are views illustrating a process of fabricating a phase change memory in a cross-point structure according to an embodiment of the present invention.

Figure 5:
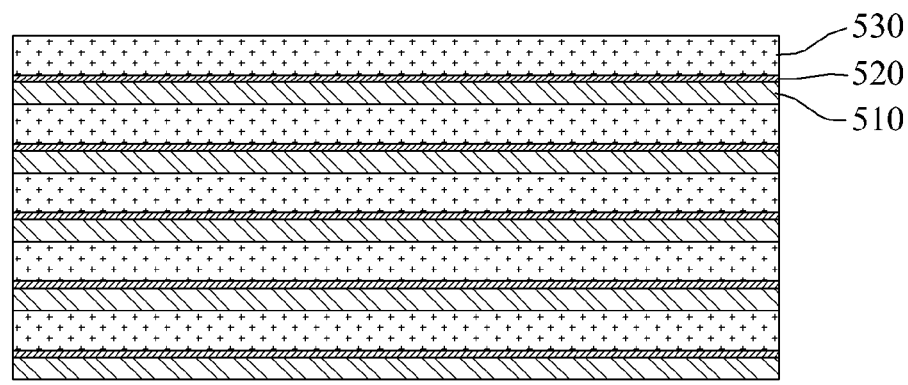
FIGS. 5 through 9 are views illustrating a process of fabricating a phase change memory in a cross-point structure according to an embodiment of the present invention.

Referring to FIG. 5, a first conductive layer 510, a phase change layer 520, and an insulating layer 530 may be sequentially disposed, which may be repeatedly performed. Accordingly, a plurality of wiring layers each including the first conductive layer 510 and the phase change layer 520 may be alternately formed.

Figure 6:
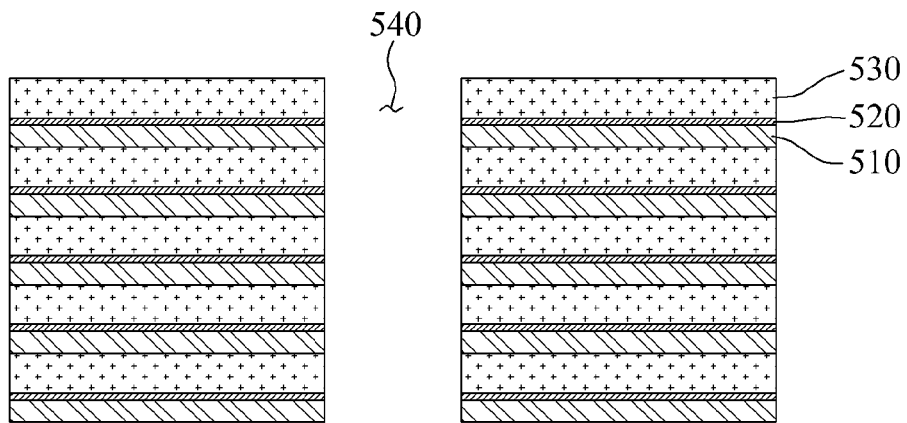

Referring to FIG. 6, an empty space 540 may be formed to pass through the first conductive layer 510, the phase change layer 520, and the insulating layer 530 that are repeatedly and alternately disposed.

Figure 7:
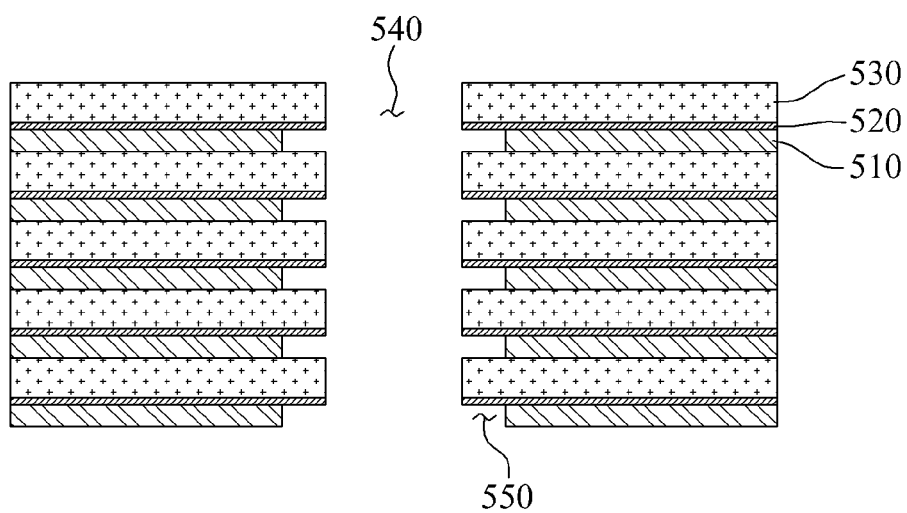

Referring to FIG. 7, a horizontal etching process with respect to the first conductive layer 510 in the structure of FIG. 6 may be performed. Through the etching process, a space 550 in which a discrete insulator 560 is to be formed may be secured.

Figure 8:
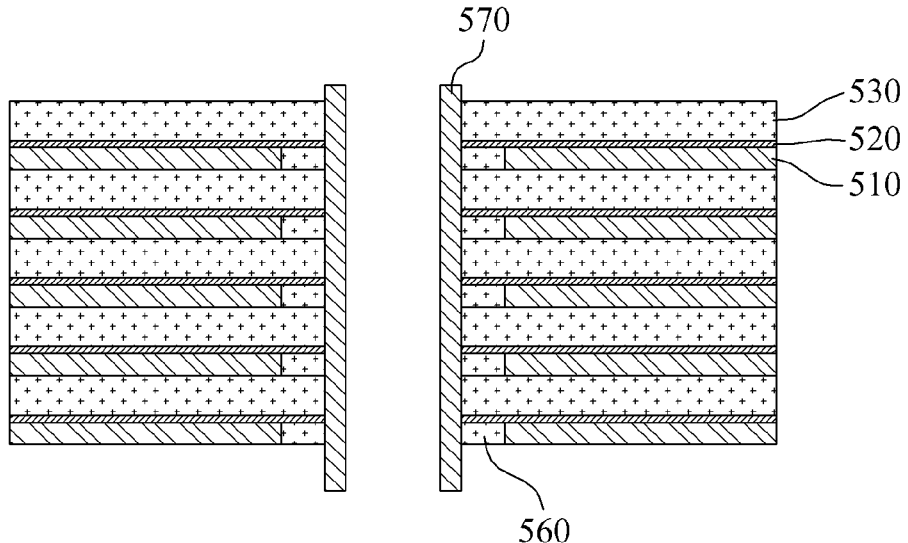

Referring to FIG. 8, a process of disposing the insulator 560 in the space 550 horizontally etched from the structure of FIG. 7 may be performed. A heater layer 570 may be disposed along an outer wall of the empty space 540.

Figure 9:
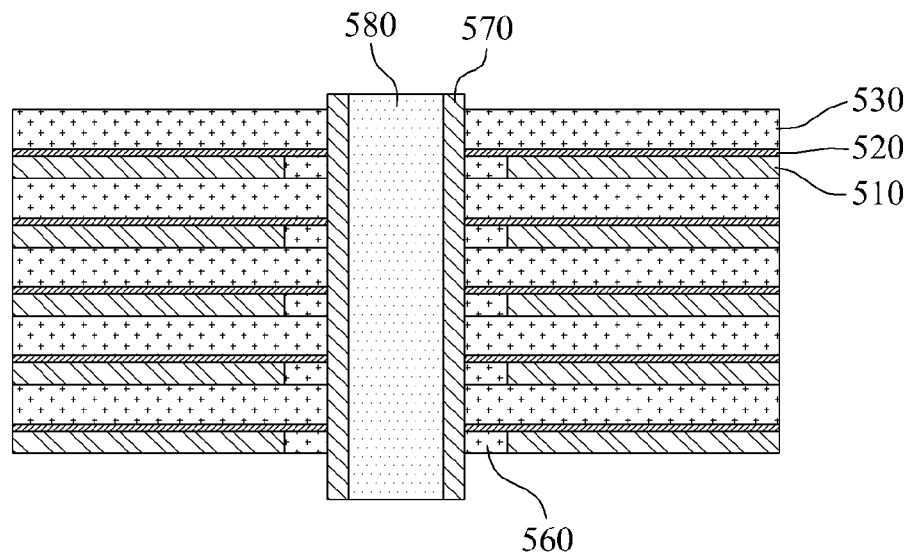

Referring to FIG. 9, a second conductive layer 580 may fill in an open space after disposing the heater layer 570 in the structure of FIG. 8.

Figure 10:
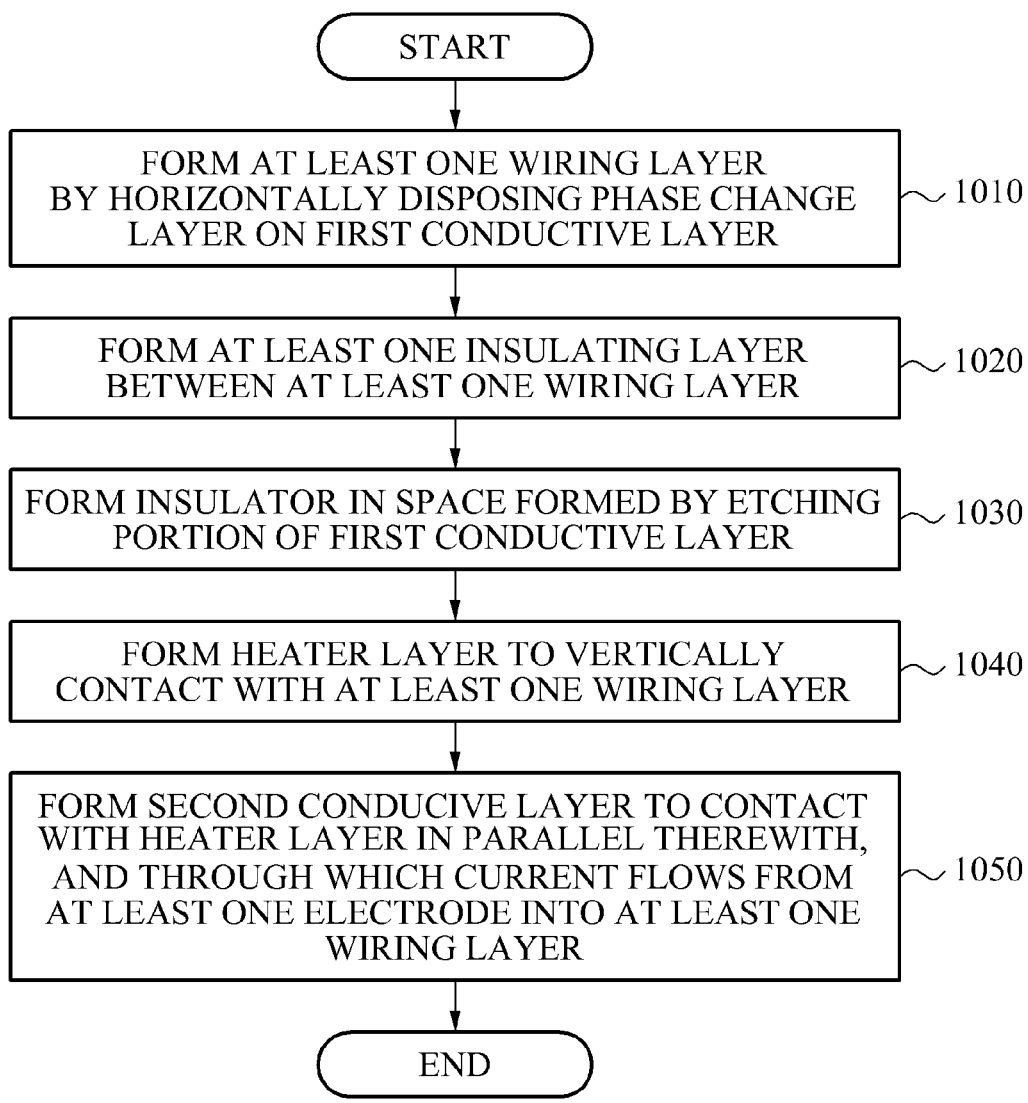
FIG. 10 is a flowchart illustrating a method of fabricating a phase change memory according to an embodiment of the present invention.

FIG. 10 is a flowchart illustrating a method of fabricating a phase change memory according to an embodiment of the present invention.

Referring to FIG. 10, in operation 1010, at least one wiring layer may be formed by horizontally disposing a phase change layer on a first conductive layer. For example, the phase change layer may be horizontally disposed on the first conductive layer using an ALD method.

In operation 1020, at least one insulating layer may be formed between the at least one wiring layer. In operation 1030, an insulator may be formed in a space formed by etching a portion of the first conductive layer. For example, the insulator may be formed on a portion in which a heater layer contacts with the corresponding wiring layer.

In operation 140, the heater layer may be formed to vertically contact with the at least one wiring layer. In operation 1050, a second conducive layer may be formed to contact with the heater layer in parallel therewith, and through which current flows from at least one electrode into the at least one wiring layer.

At least one lower electrode connected to the at least one wiring layer may be formed, and an upper electrode connected to the second conductive layer may be formed.

According to an aspect, there may be provided a phase change memory in a 3D memory structure that may secure scalability in view of a horizontal dimension and thereby significantly decrease a number of vertically multilayered layers, and may reduce fabrication cost in view of process technology. Through vertical scaling, it is possible to secure a stable cell characteristic and stability in the 3D memory structure.

According to an aspect, a phase change memory may be provided in a structure of a 3D NAND flash memory device that may employ a thickness of a phase change material as a contact area and may dispose a phase change material on a conductive layer using an ALD method and thereby reduce a thickness of a thin film of a phase change layer and significantly decrease driving current density.

According to an aspect, the phase change memory may enhance a degree of integration by utilizing a 3D structure and may secure data reliability by a change in resistance at a data storage cross-point.

According to an aspect, the phase change memory may be provided in a structure in which a memory phase change material is disposed on or below a horizontally formed wiring conductive layer, instead of forming a memory phase change material within a contact hole. Here, in a multilayered structure, the phase change material may have a contact area corresponding to a thickness of an atomic layer.

According to an aspect, in a multilayered structure of the phase change memory, a to phase change layer may be disposed on or below a conductive layer and may contact only with a vertically formed heater layer or a conductive layer and a phase layer. Accordingly, a cross-point structure may be configured.

According to an aspect, the phase change memory may be provided in a structure in which a phase change material is horizontally disposed below a conductive layer in order to further smoothen a wiring with a neighboring circuit. The phase change memory may also be provided in a structure in which the phase change material is horizontally disposed on the conductive layer in order to decrease contact resistance by etching a portion of the phase change material.

Figure 11:
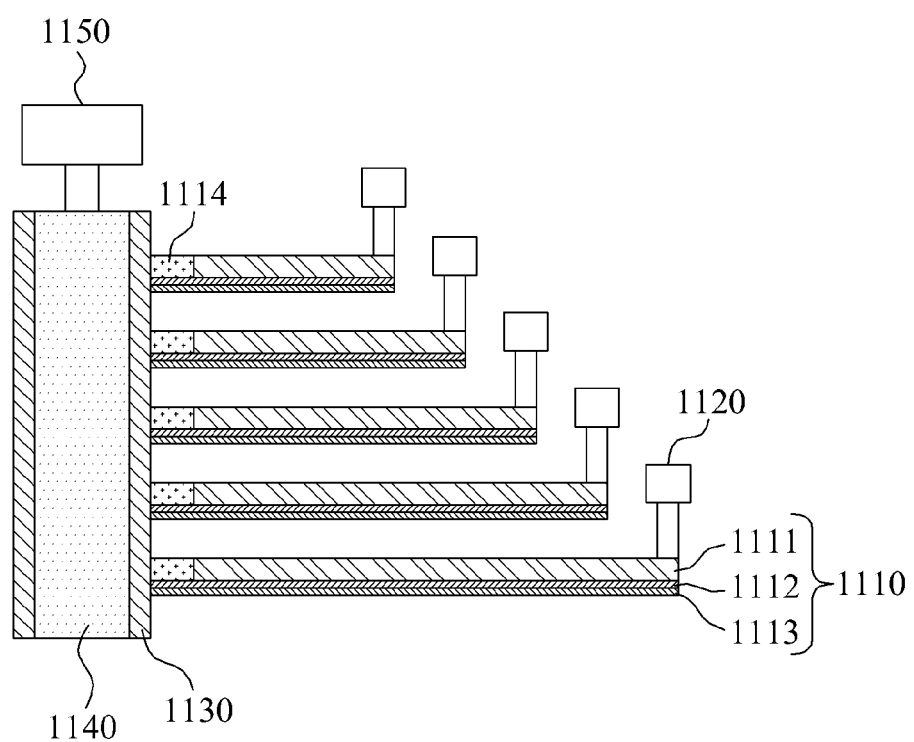
FIG. 11 is a vertical cross-sectional view illustrating a structure of a phase change memory according to an embodiment of the present invention.
Figure 12:
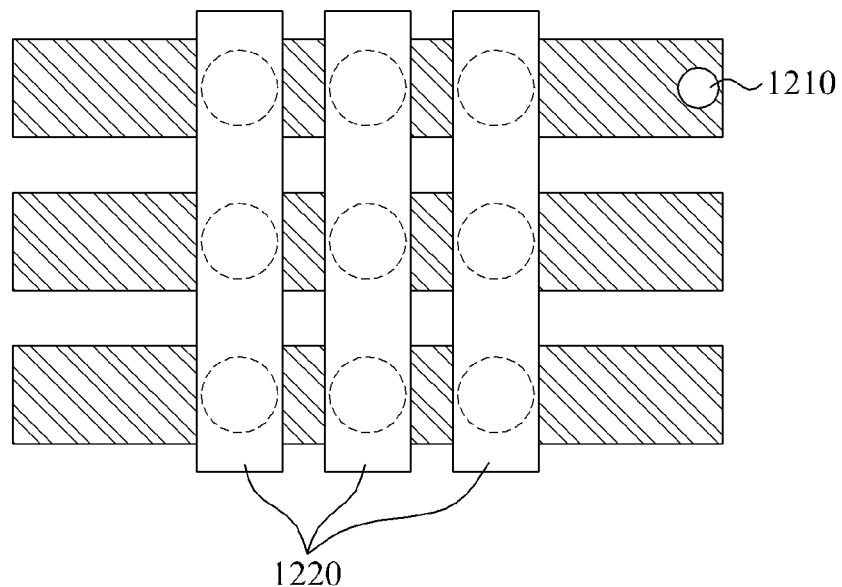
FIG. 12 is a horizontal cross-sectional view illustrating a structure of a phase change memory according to an embodiment of the present invention.

FIG. 11 is a vertical cross-sectional view illustrating a structure of a phase change memory according to an embodiment of the present invention, and FIG. 12 is a horizontal cross-sectional view illustrating a structure of a phase change memory according to an embodiment of the present invention.

Referring to FIGS. 11 and 12, the phase change memory may be provided in a structure in which a phase change layer 1112 made of a phase change material is formed below a first conductive layer 1111.

The phase change memory may include at least one wiring layer 1110 each including the first conductive layer 1111 and at least two phase change layers 1112 and 1113 horizontally disposed on a bottom surface of the first conductive layer 1111; at least one insulating layer horizontally disposed on a top surface of the at least one wiring layer 1110; a lower electrode 1120 or 1210 connected to a top surface of the first conductive layer 1111 through a space formed by vertically etching a portion of the at least one insulating layer; a heater layer 1130 disposed to vertically contact with the at least one wiring layer 1110; and a second conductive layer 1140 disposed to contact with the heater layer 1130 in parallel therewith, and through which current flows from at least one electrode into the at least one wiring layer 1110. The phase change memory may connect an upper electrode 1150 or 1220 to the second conductive layer 1140.

The at least two phase change layers 1112 and 1113 may be made of a phase change material having a thickness less than a thickness of the first conductive layer 1111, and may be horizontally disposed on the first conductive layer 1111 using an ALD method.

The phase change layers 1112 and 1113 may be made of different phase change materials and thus, may be construed having parallel resistance with respect to the first conductive layer 1111. Also, the phase change layers 1112 and 1113 may be made of different materials and thus, may have different attributes and have different phase change areas. Accordingly, the at least two phase change layers 1112 and 1113 made of different phase change materials may perform a multi-level cell (MLC) operation due to different phase change areas in the same pulse.

The phase change memory may form an insulator 1114 in a space formed by etching a portion of the first conductive layer 1111. The insulator 1114 may be formed on a portion in which the heater layer 1130 contacts with the corresponding insulating layer 1110.

Figure 13:
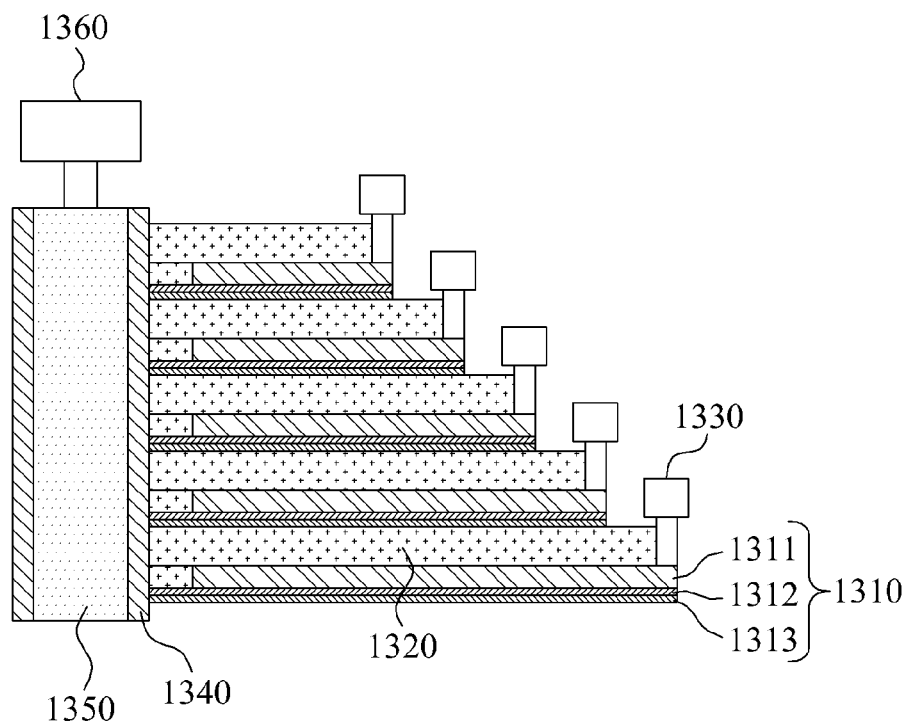
FIG. 13 is a vertical cross-sectional view illustrating a structure of a phase change memory including an inter-layer insulating layer according to an embodiment of the present invention.

FIG. 13 is a vertical cross-sectional view illustrating a structure of a phase change memory including an inter-layer insulating layer according to an embodiment of the present invention.

Referring to FIG. 13, the phase change memory may form phase change layers 1312 and 1313 with a thickness of an atomic layer on a bottom surface of a first conductive layer 1311 and a top surface of an insulating layer 1320, and may connect a lower electrode 1330 through a space formed by etching the insulating layer 1320 corresponding to an edge of the wiring layer 1310. Also, the phase change memory may include a heater layer 1340 disposed to vertically contact with the at least one wiring layer 1310 and a second conductive layer 1350 disposed to contact with the heater layer 1340 in parallel therewith and through which current flows from at least one electrode into the at least one wiring layer 1310.

The at least one wiring layer 1310 may be separated from each other by at least one insulating layer 1320. In the at least one wiring layer 1310, the wiring layer 1310 disposed in a lower portion may have a relatively wide area compared to the wiring layer 1310 disposed in an upper portion.

The phase change memory may have a phase change in a portion in which the horizontally formed phase change layers 1312 and 1313 vertically contact with the heater layer 1340 or a portion close to the heater layer 1340. Current may flow between the wiring layer 1310 and the second conductive layer 1350 according to crystallization of the phase change layers 1312 and 1313. Here, the horizontally formed phase change layers 1312 and 1313 may secure a significantly thin thickness of 1 nm or less using an ALD method or the like, and thereby significantly decrease driving current density.

The phase change memory may utilize, as a horizontal wiring, a structure in which a memory layer and a conductive layer are multilayered and thus, may be expanded and thereby applied to a 3D ReRAM and a 3D flash memory using an ONO layer. The phase change memory may be provided in a 3D memory structure that enables scaling by forming a memory material within a contact hole.

Figure 14:
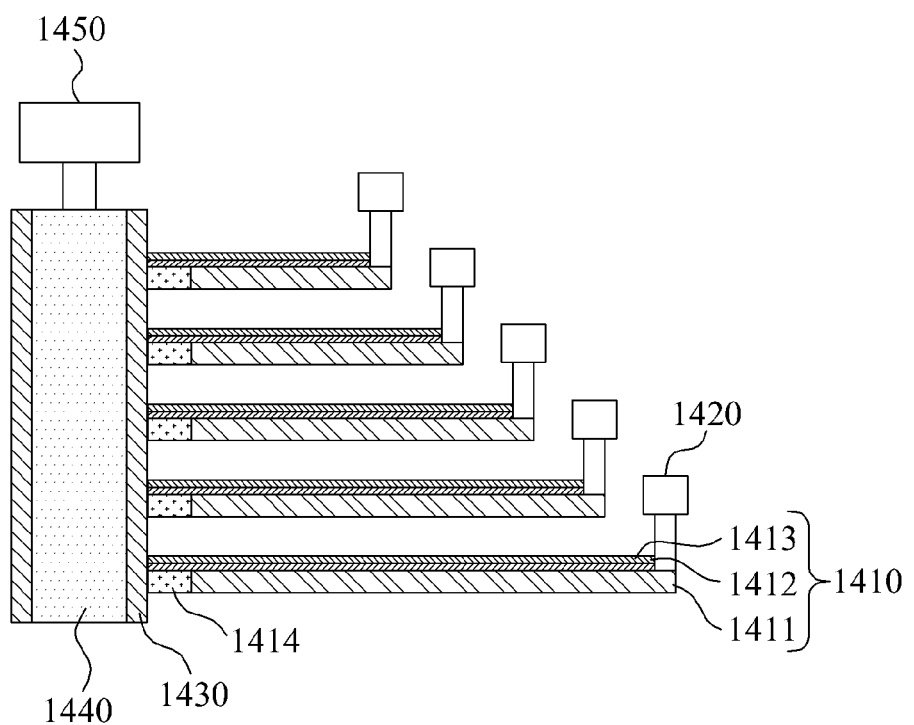
FIG. 14 is a vertical cross-sectional view illustrating a structure of a phase change memory according to another embodiment of the present invention.
Figure 15:
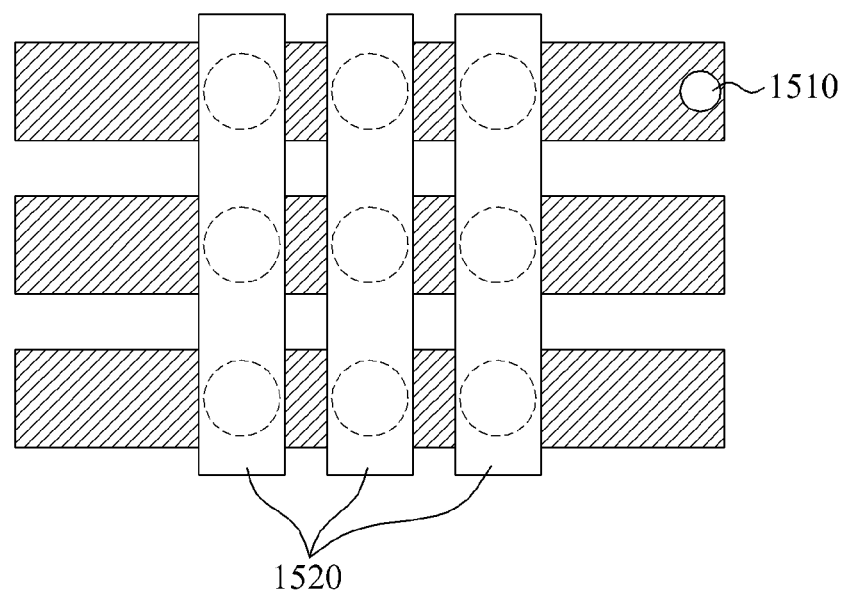
FIG. 15 is a horizontal cross-sectional view illustrating a structure of a phase change memory according to another embodiment of the present invention.

FIG. 14 is a vertical cross-sectional view illustrating a structure of a phase change memory according to another embodiment of the present invention, and FIG. 15 is a horizontal cross-sectional view illustrating a structure of a phase change memory according to another embodiment of the present invention.

Referring to FIGS. 14 and 15, the phase change memory may be provided in a structure in which at least two phase change layers 1412 and 1413 made of a phase change material are disposed below a first conductive layer 1411.

The phase change memory may include at least one wiring layer 1410 each including the first conductive layer 1411 and at least two phase change layers 1412 and 1413 horizontally disposed on a top surface of the first conductive layer 1411; at least one insulating layer horizontally disposed on a top surface of the at least one wiring layer 1410; a lower electrode 1420 or 1510 connected to the top surface of the first conductive layer 1411 exposed by etching a portion of the at least two phase change layers 1412 and 1413 through a space formed by vertically etching a portion of the at least one insulating layer; a heater layer 1430 disposed to vertically contact with the at least one wiring layer 1410; and a second conductive layer 1440 disposed to contact with the heater layer in parallel therewith, and through which current flows from at least one electrode into the at least one wiring layer 1410. Also, the phase change memory may connect an upper electrode 1450 or 1520 to the second conducive layer 1440.

The at least two phase change layers 1412 and 1413 may be made of a phase change material having a thickness less than a thickness of the first conductive layer 1411, and may be horizontally disposed on the first conductive layer 1411 using an ALD method.

The phase change layers 1412 and 1413 may be made of different phase change materials and thus, may be construed having parallel resistance with respect to the first conductive layer 1411. Also, the phase change layers 1412 and 1413 may be made of different materials and thus, may have different attributes and have different phase change areas. Accordingly, the at least two phase change layers 1412 and 1413 made of different phase change layers may perform an MLC operation due to different phase change areas in the same pulse.

The phase change memory may form an insulator 1414 in a space formed by etching a portion of the first conductive layer 1411. The insulator 1414 may be formed on a portion in which the heater layer 1430 contacts with the corresponding insulating layer 1410.

Figure 16:
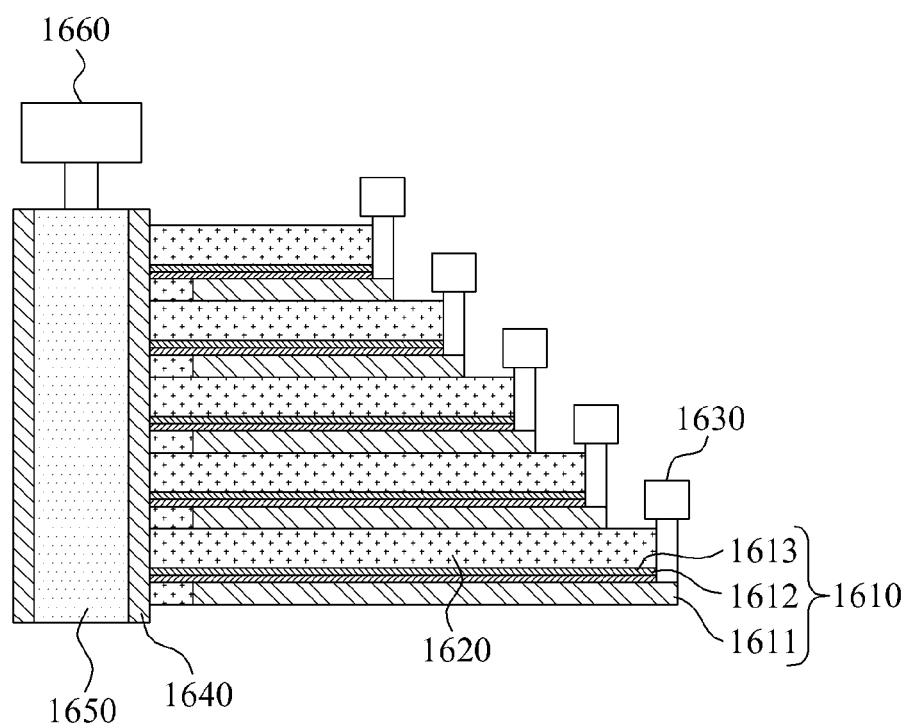
FIG. 16 is a vertical cross-sectional view illustrating a structure of a phase change memory including an inter-layer insulating layer according to another embodiment of the present invention.

FIG. 16 is a vertical cross-sectional view illustrating a structure of a phase change memory including an inter-layer insulating layer according to another embodiment of the present invention.

Referring to FIG. 16, when forming a wiring contact enabling a lower electrode 1630 to contact with an edge of a wiring layer 1610, the phase change memory may connect the lower electrode 1630 to a first conductive layer 1611 exposed by etching an insulating layer 1620 and at least two phase change layers 1612 and 1613. Also, the phase change memory may include a heater layer 1640 disposed to vertically contact with the at least one wiring layer 1610 and a second conductive layer 1650 disposed to contact with the heater layer 1640 in parallel therewith and through which current flows from at least one electrode into the at least one wiring layer 1610. The phase change memory may connect an upper electrode 1660 to the second conductive layer 1650.

Figure 17:
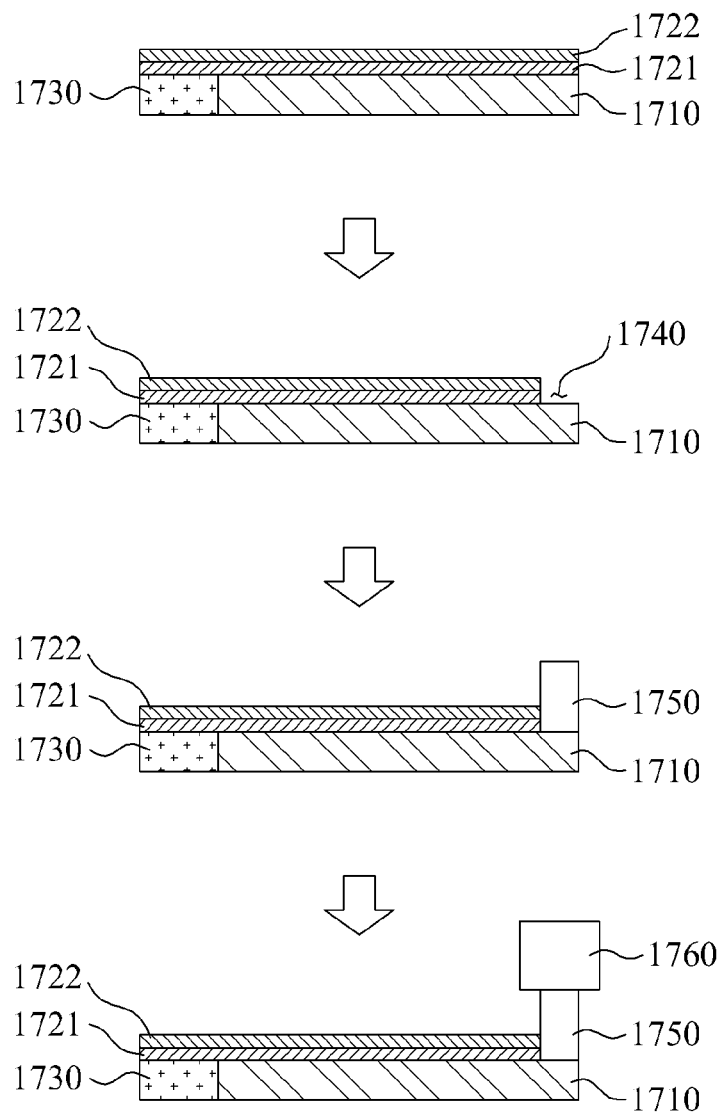
FIG. 17 is a view illustrating a process of connecting a wiring layer and a lower electrode in a phase change memory according to another embodiment of the present invention.

FIG. 17 is a view illustrating a process of connecting a wiring layer and a lower electrode in a phase change memory according to another embodiment of the present invention.

Referring to FIG. 17, a single wiring layer may be configured by horizontally disposing a first conductive layer 1710 and at least two phase change layers 1721 and 1722 on the first conductive layer 1710 and by forming an insulator 1730 by etching a portion of the first conductive layer 1710. Here, the phase change memory may form an insulating layer horizontally disposed on a top surface of the phase change layers 1721 and 1722, and may connect a wiring contact 1750 and a lower electrode 1760 to the top surface of the first conductive layer 1710 exposed by etching a portion of the phase change layers 1721 and 1722 through a space 1740 formed by vertically etching a portion of the insulating layer.

Figure 18:
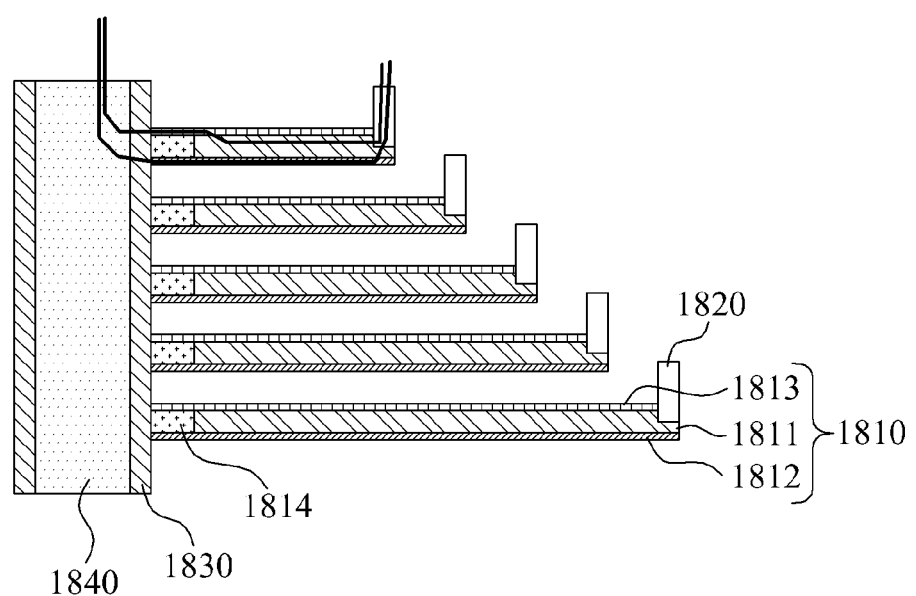
FIG. 18 is a vertical cross-sectional view illustrating a structure of a phase change memory according to still another embodiment of the present invention.

FIG. 18 is a vertical cross-sectional view illustrating a structure of a phase change memory according to still another embodiment of the present invention.

Referring to FIG. 18, the phase change memory may include at least one wiring layer 1810 each including a first conductive layer 1811, at least one first phase change layer 1813 horizontally disposed on a top surface of the first conductive layer 1811, and at least one second phase change layer 1812 horizontally disposed on a bottom surface of the first conductive layer 1811; at least one insulating layer horizontally disposed on a top surface of the at least one wiring layer 1810; a lower electrode 1820 connected to the top surface of the to first conductive layer 1811 exposed by etching a portion of the at least one first phase change layer 1813 through a space formed by vertically etching a portion of the at least one insulating layer 1813; a heater layer 1830 disposed to vertically contact with the at least one wiring layer 1810; and a second conductive layer 1840 disposed to contact with the heater layer 1840 in parallel therewith, and through which current flows from at least one electrode into the at least one wiring layer 1810.

The first phase change layer 1813 and the second phase change layer 1812 may be made of a phase change material having a thickness less than a thickness of the first conductive layer 1811, and may be horizontally disposed on the first conductive layer 1811 using an ALD method. Also, the first phase change layer 1813 and the second phase change layer 1812 may be made of different phase change materials.

The first phase change layer 1813 and the second phase change layer 1812 may be made of using different phase change materials and thus, may be construed having parallel resistance with respect to the first conductive layer 1811. Also, the first phase change layer 1813 and the second phase change layer 1812 may be made of different materials and thus, may have different attributes and have different phase change areas. Accordingly, the phase first phase change layer 1813 and the second phase change layer 1812 made of different phase change materials may perform an MLC operation due to different phase change areas in the same pulse.

The phase change memory may form an insulator 1814 in a space formed by etching a portion of the first conductive layer 1811. The insulator 1814 may be formed on a portion in which the heater layer 1830 contacts with the corresponding insulating layer 1810.

Hereinafter, a method of fabricating a phase change memory in a structure in which a phase change layer is formed on a bottom surface of a conductive layer according to an embodiment of the present invention will be described.

Figure 19:
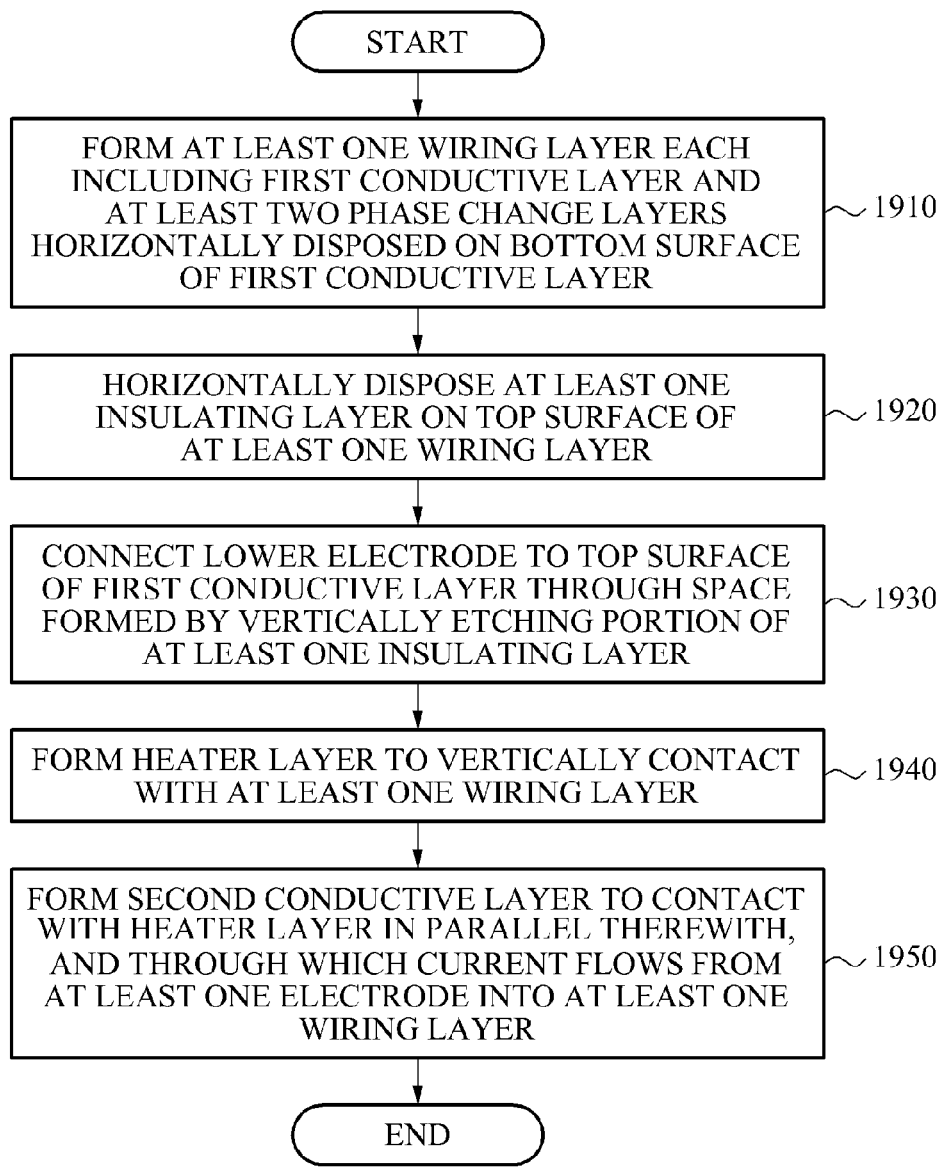
FIG. 19 is a flowchart illustrating a method of fabricating a phase change memory in a structure in which a phase change layer is formed on a bottom surface of a conductive layer according to an embodiment of the present invention.

FIG. 19 is a flowchart illustrating a method of fabricating a phase change memory in a structure in which a phase change layer is formed on a bottom surface of a conductive layer according to an embodiment of the present invention.

Referring to FIG. 19, in operation 1910, at least one wiring layer each including a first conductive layer and at least two phase change layers horizontally disposed on a bottom surface of the first conductive layer may be formed. In operation 1920, at least one insulating layer may be horizontally disposed on a top surface of the at least one wiring layer. In operation 1930, a lower electrode may be connected to a top surface of the first conductive layer through a space formed by vertically etching a portion of the at least one insulating layer. In operation 1940, a heater layer may be formed to vertically contact with the at least one wiring layer. In operation 1950, a second conductive layer may be formed to contact with the heater layer in parallel therewith, and through which current flows from at least one electrode into the at least one wiring layer.

Hereinafter, a method of fabricating a phase change memory in a structure in which a phase change layer is formed on a top surface of a conductive layer according to an embodiment of the present invention will be described.

Figure 20:
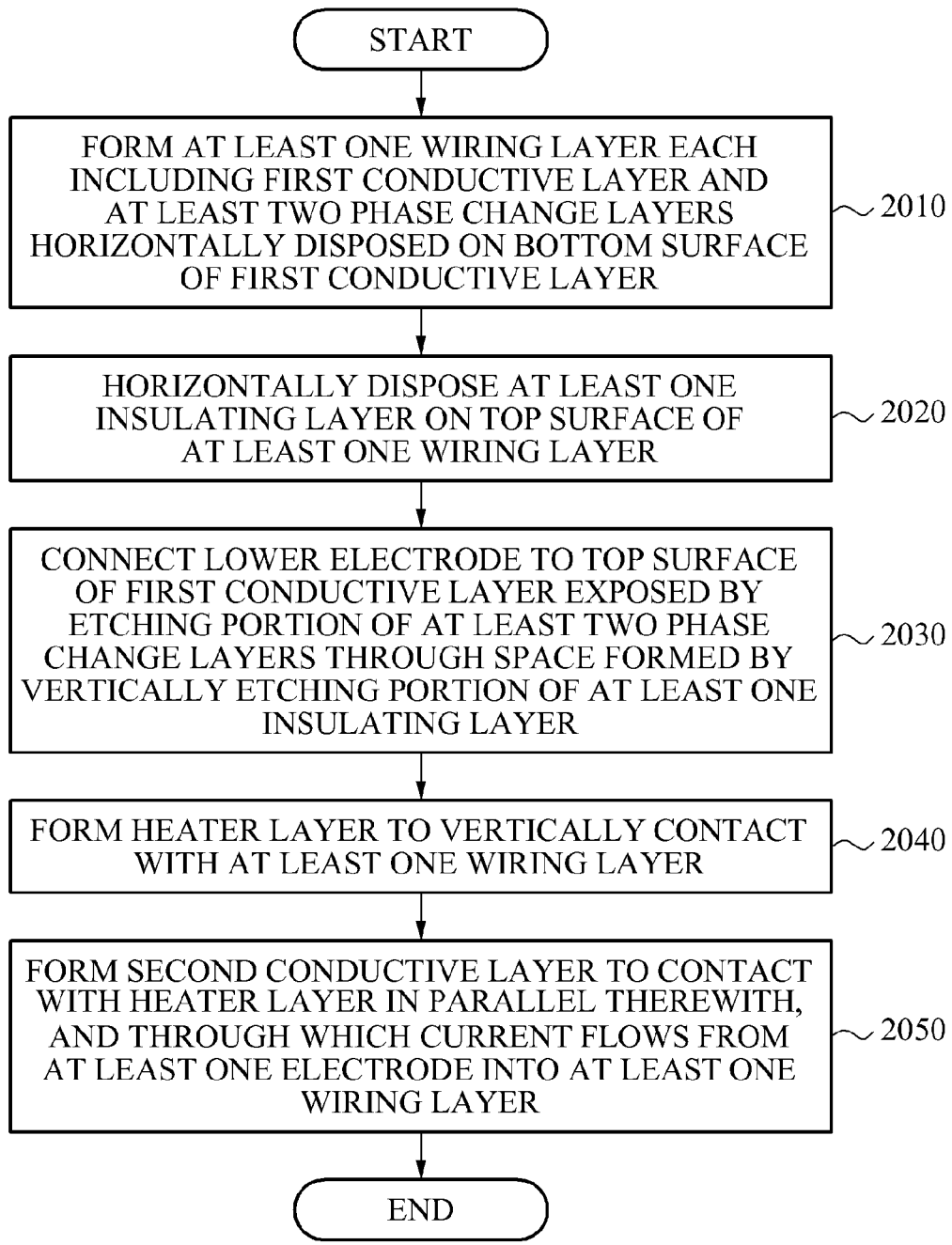
FIG. 20 is a flowchart illustrating a method of fabricating a phase change memory in a structure in which a phase change layer is formed on a top surface of a conductive layer according to an embodiment of the present invention.

FIG. 20 is a flowchart illustrating a method of fabricating a phase change memory in a structure in which a phase change layer is formed on a top surface of a conductive layer according to an embodiment of the present invention.

Referring to FIG. 20, in operation 2010, at least one wiring layer each including a first conductive layer and at least two phase change layers horizontally disposed on a top surface of the first conductive layer may be formed. In operation 2020, at least one insulating layer may be horizontally formed disposed on a top surface of the at least one wiring layer. In operation 2030, a lower electrode may be connected to the top surface of the first conductive layer exposed by etching a portion of the at least two phase change layers through a space formed by vertically etching a portion of the at least one insulating layer. In operation 2040, a heater layer may be formed to vertically contact with the at least one wiring to layer. In operation 2050, a second conductive layer may be formed to contact with the heater layer in parallel therewith, and through which current flows from at least one electrode into the at least one wiring layer.

Hereinafter, a method of fabricating a phase change memory in a structure in which a phase change layer is formed on each of a top surface and a bottom surface of a conductive layer according to an embodiment of the present invention.

Figure 21:
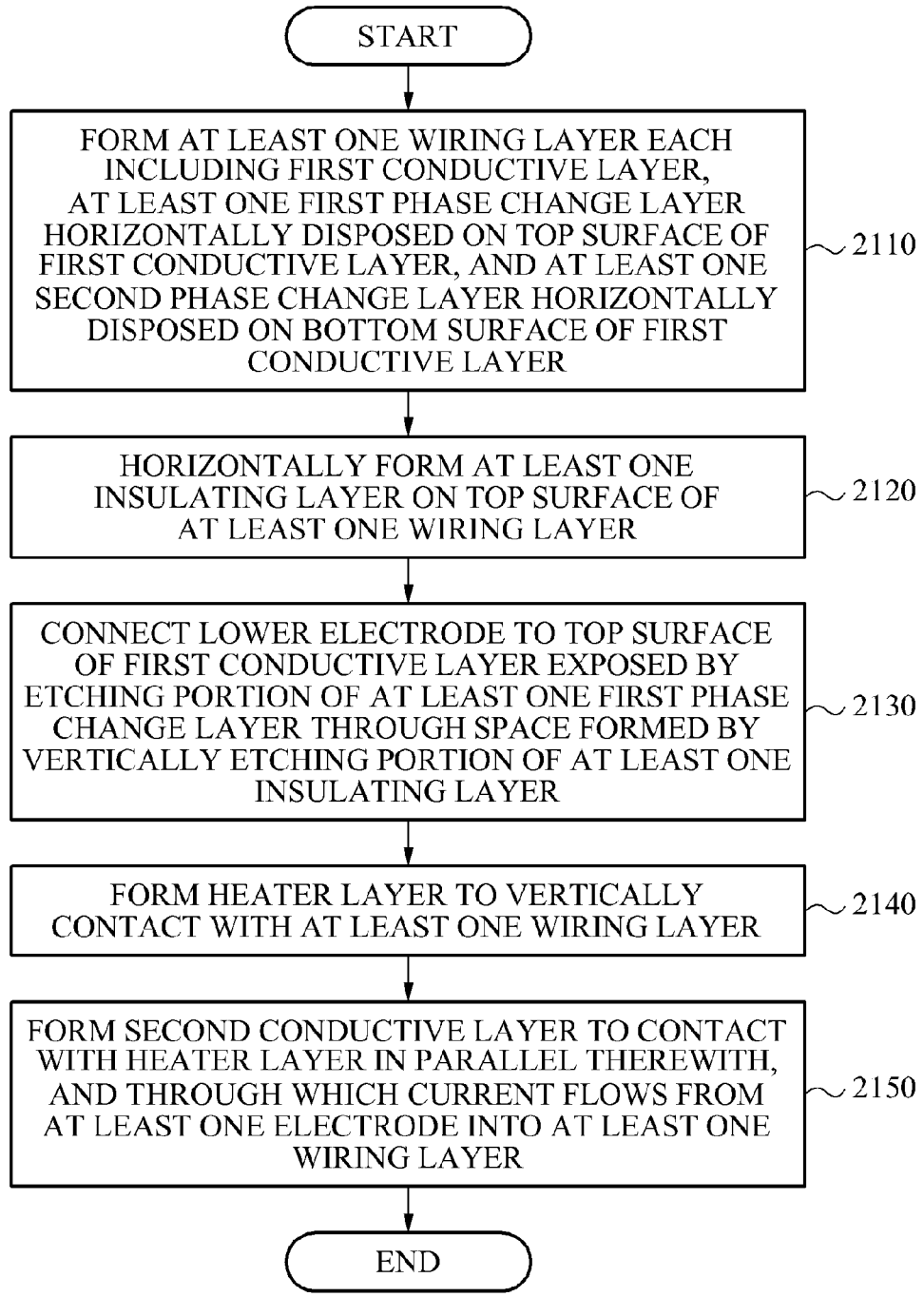
FIG. 21 is a flowchart illustrating a method of fabricating a phase change memory in a structure in which a phase change layer is formed on each of a top surface and a bottom surface of a conductive layer according to an embodiment of the present invention.

FIG. 21 is a flowchart illustrating a method of fabricating a phase change memory in a structure in which a phase change layer is formed on each of a top surface and a bottom surface of a conductive layer according to an embodiment of the present invention.

Referring to FIG. 21, in operation 2110, at least one wiring layer each including a first conductive layer, at least one first phase change layer horizontally disposed on a top surface of the first conductive layer, and at least one second phase change layer horizontally disposed on a bottom surface of the first conductive layer may be formed. In operation 2120, at least one insulating layer may be horizontally disposed on a top surface of the at least one wiring layer. In operation 2130, a lower electrode may be connected to the top surface of the first conductive layer exposed by etching a portion of the at least one first phase change layer through a space formed by vertically etching a portion of the at least one insulating layer. In operation 2140, a heater layer may be formed to vertically contact with the at least one wiring layer. In operation 2150, a second conductive layer may be formed to contact with the heater layer in parallel therewith, and through which current flows from at least one electrode into the at least one wiring layer.

According to an aspect, there may be provided a phase change memory in a 3D memory structure that may secure scalability in view of a horizontal dimension and thereby significantly decrease a number of vertically multilayered layers, and may reduce fabrication cost in view of process technology. Through vertical scaling, it is possible to secure a stable cell characteristic and stability in the 3D memory structure.

According to an aspect, a phase change memory may be provided in a structure of a 3D NAND flash memory device that may employ a thickness of a phase change material as a contact area and may dispose a phase change material on a conductive layer using an ALD method and thereby reduce a thickness of a thin film of a phase change layer and significantly decrease driving current density.

According to an aspect, the phase change memory may enhance a degree of integration by utilizing a 3D structure and may secure data reliability by a change in resistance at a data storage cross-point.

According to an aspect, the phase change memory may be provided in a structure in which phase change materials are separated between cells and thereby formed on or below a horizontally formed conductive layer instead of vertically forming a phase change material, for example, a resistive change layer within a contact hole. In such a multilayered structure, the phase change layers are separated by an interlayer insulating layer to thereby prevent inter-cell interference. Accordingly, the reliability for MLC may be secured.

According to an aspect, the phase change memory may perform MLC of a bit/cell state, for example, 2 bit/cell and 3 bit/cell state, based on an etch rate of a side surface of a horizontally formed conductive layer.

Figure 22:
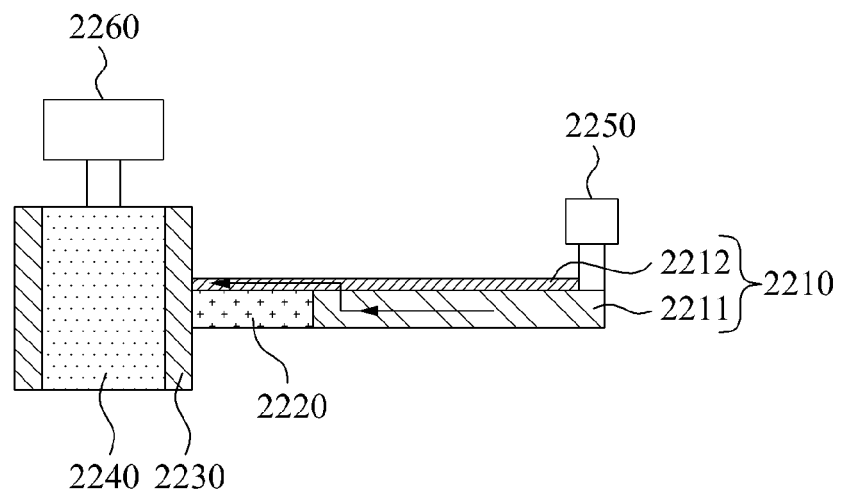
FIG. 22 is a vertical cross-sectional view illustrating a structure of a phase change memory according to still another embodiment of the present invention.

FIG. 22 is a vertical cross-sectional view illustrating a structure of a phase change memory according to still another embodiment of the present invention.

Referring to FIG. 22, the phase change memory may include at least one wiring layer 2210 each including a first conductive layer 2211 and a phase change layer 2212 horizontally disposed on the first conductive layer 2211, an insulator 2220, a heater layer 2230, and a second conductive layer 2240.

The insulator 2220 may be filled in a space formed by etching a portion of the first conducive layer 2211. The heater layer 2230 may be disposed to vertically contact with the at least one wiring layer 2210. The second conductive layer 2240 may be disposed to contact with the heater layer 2230 in parallel therewith, and through which current flows from at least one electrode into the at least one wiring layer 2210. Also, the insulator 2220 may be formed on a portion in which the heater layer 2230 contacts with the corresponding wiring layer 2210. The at least one wiring layer 2210 may be separated from each other by at least one insulating layer disposed between the at least one wiring layer 2210.

The phase change memory may connect a lower electrode 2250 to the at least one wiring layer 2210, and may connect an upper electrode 2260 to the second conductive layer 2240.

The phase change memory may perform a multilevel bit/cell operation based on an etch rate of the first conductive layer 2211. Here, an amount of current passing through the second conductive layer 2240 may vary based on a crystallization state of the phase change layer 2212.

The phase change layer 2212 may be made of a phase change material having a thickness less than a thickness of the first conductive layer 2211, and may be horizontally disposed on the first conductive layer 2211 using an ALD method and may have a phase change in a portion vertically contacting with the heater layer 2230.

The phase change memory may form the phase change layer 2212 by vertically disposing a single atomic layer, for example, a single atomic layer of 1 nm or less on a top surface or a bottom surface of the first conductive layer 2211 using a phase change material and using an ALD method, and may use the phase change layer 2212 as a memory site. The phase change memory may remove a memory storage material within a vertical contact hole and thus, scaling of a contact area is enabled.

The phase change memory may be provided in a cross-point structure through the following process. Although only a single wiring layer 2210 is structuralized in FIG. 1, a process of forming a plurality of wiring layers 2210 and a plurality of insulating layers and forming the insulator 2220 on each wiring layer 2210 will be described in the following.

Initially, the first conductive layer 2211, the phase change layer 2212, and the insulating layer may be sequentially disposed, which may be repeatedly performed. Accordingly, a plurality of wiring layers 2210 each including the first conductive layer 2211 and the phase change layer 2212 may be alternately formed.

An empty space may be formed to pass through the first conductive layer 2211, the phase change layer 2212, and the insulating layer that are repeatedly and alternately disposed. A horizontal etching process with respect to the first conductive layers 2211 may be performed. Through the etching process, a space in which the discrete insulator 2220 us to be formed may be secured.

A process of disposing the insulator 2220 in the horizontally etched space may be performed. The heater layer 2230 may be disposed along an outer wall of the empty space. The second conductive layer 2240 may fill in an open space after disposing the heater layer 2230.

The phase change memory formed through the above fixing process may provide a multilevel bit/cell operation based on an etch rate of the side surface of a horizontally formed conducive layer.

Figure 23:
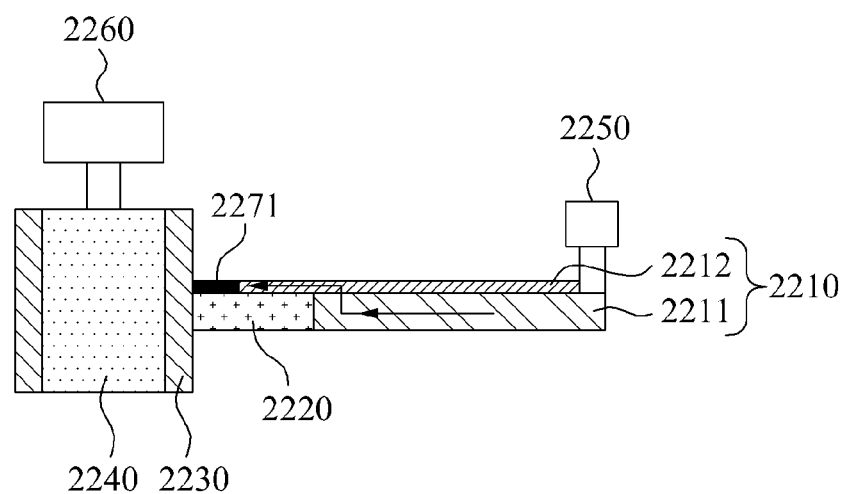
FIGS. 23 through 25 are views illustrating a multi-level cell (MLC) process according to crystallization of a phase change material.
Figure 24:
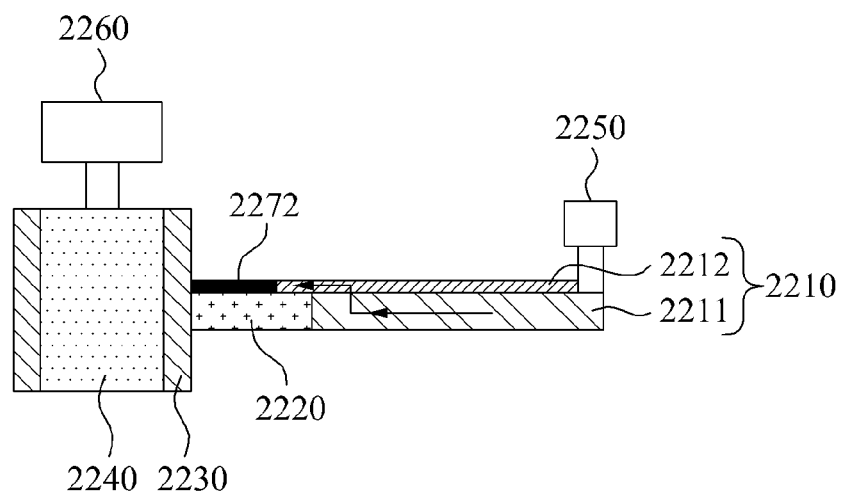
Figure 25:
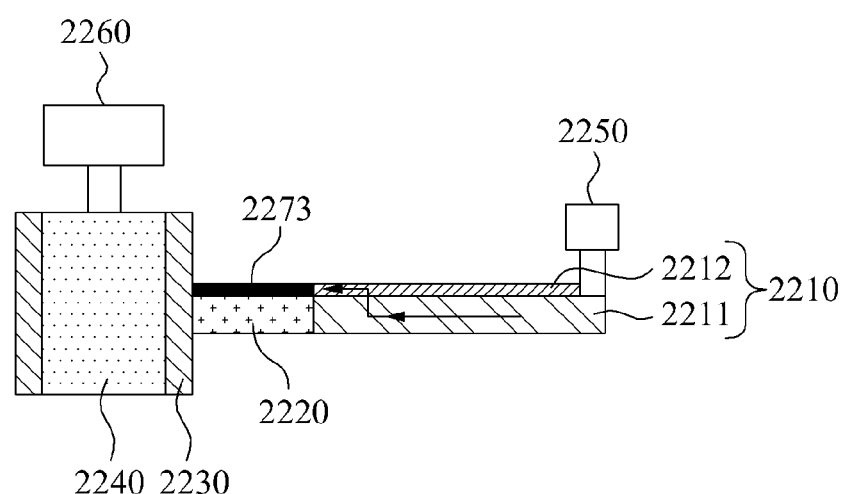

FIGS. 23 through 25 are views illustrating a MLC process according to crystallization of a phase change material.

Referring to FIGS. 23 through 25, the phase change memory may perform MLC of a 2 bit/cell state or a 3 bit/cell state based on a chemical etch rate or a dry etch rate with respect to a side surface of the horizontally formed first conductive layer 2210. FIGS. 1 through 4 illustrate a structure of a phase change memory providing a 2 bit, that is, four-level state operation method.

As illustrated in FIG. 22, in a case in which the phase change layer 2212 is high resistance of an amorphous state, the phase change memory becomes [11] state. As illustrated in FIGS. 23 and 24, the phase change memory may become [10] state 2271 and [01] state 2272 as the phase change layer 2212 enters a crystallization sate by adjusting a pulse condition.

As illustrated in FIG. 25, in a case in which the phase change layer 2212 is low resistance of a crystallization state, the phase change memory may become [00] state 2273. That is, in the pulse change memory, the phase change layer 2212 may be changed from the amorphous state to the crystallization state based on a difference in an amount of current corresponding to a pulse condition.

Figure 26:
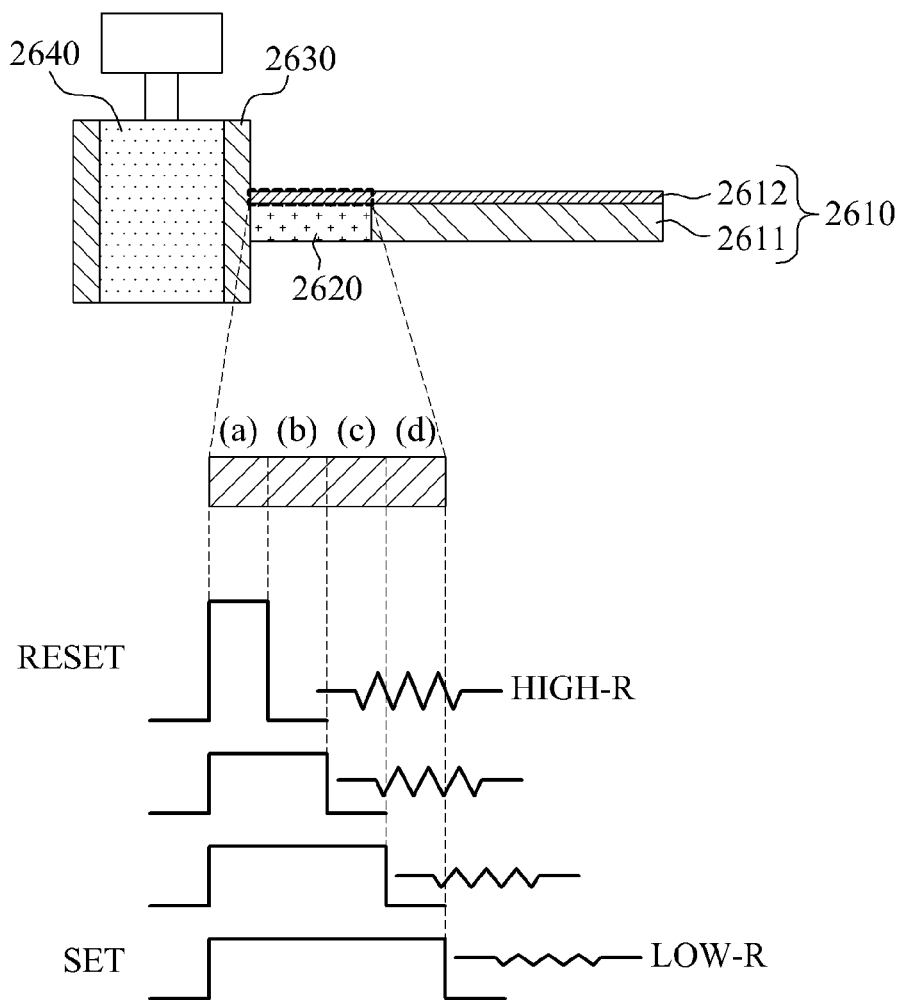
FIG. 26 is a view illustrating a 2 bit/cell operation state based on an etch rate of a side surface of a horizontally formed conductive layer.
Figure 27:
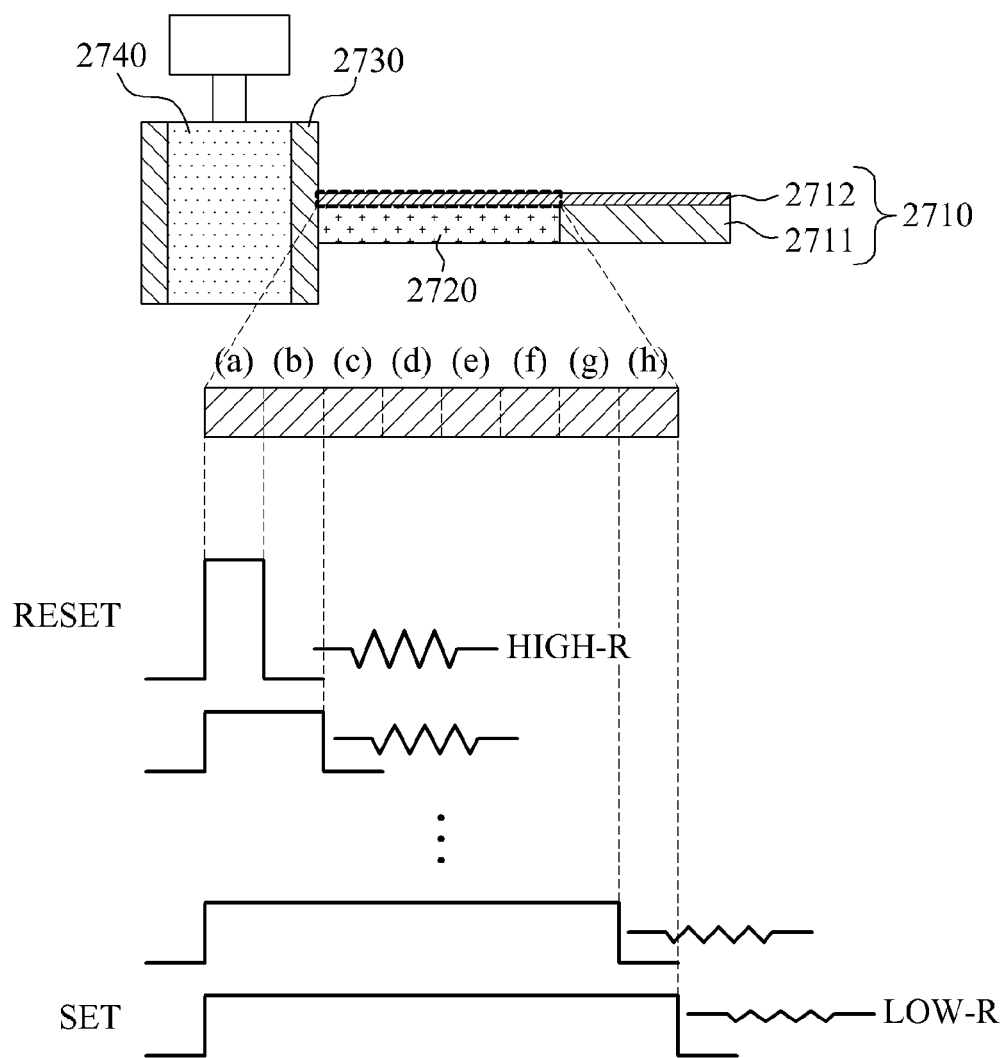
FIG. 27 is a view illustrating a 3 bit/cell operation state based on an etch rate of a side surface of a horizontally formed conductive layer.

FIG. 26 is a view illustrating a 2 bit/cell operation state based on an etch rate of a side surface of a horizontally formed conductive layer, and FIG. 27 is a view illustrating a 3 bit/cell operation state based on an etch rate of a side surface of a horizontally formed conductive layer.

A phase change memory may provide a large capacity of a device based on an MLC by adjusting an etch rate of a side surface of a horizontally formed conductive layer and a pulse condition, and may also enhance a degree of integration of the device.

For example, as illustrated in FIG. 26, the phase change memory may include at least one wiring layer 2610 each including a first conductive layer 2611 and a phase change layer 2612 horizontally disposed on the first conductive layer 2611, an insulator 2620, a heater layer 2630, and a second conductive layer 2640. The insulator 2620 may fill in a space formed by etching a portion of the first conductive layer 2611. Here, the phase change memory may provide a 2 bit-MLC structure based on an etch rate for forming the insulator 2620 and a pulse condition, for example, a, b, c, and d.

As another example, as illustrated in FIG. 27, the phase change memory may include at least one wiring layer 2710 each including a first conductive layer 2711 and a phase change layer 2712 horizontally disposed on the first conductive layer 2711, an insulator 2720, a heater layer 2730, and a second conductive layer 2740. The insulator 2720 may fill in a space formed by etching a portion of the first conductive layer 2611. Here, the phase change memory may provide a 3 bit-MLC structure based on an etch rate for forming the insulator 2720 and a pulse condition, for example, a, b, c, d, e, f, g, and h. The phase change memory of FIG. 27 may provide a 3 bit-MLC operation due to a high etch rate configuring the insulator 2720 compared to the phase change memory of FIG. 26.

Hereinafter, a method of fabricating a phase change memory according to an embodiment of the present invention will be described.

Figure 28:
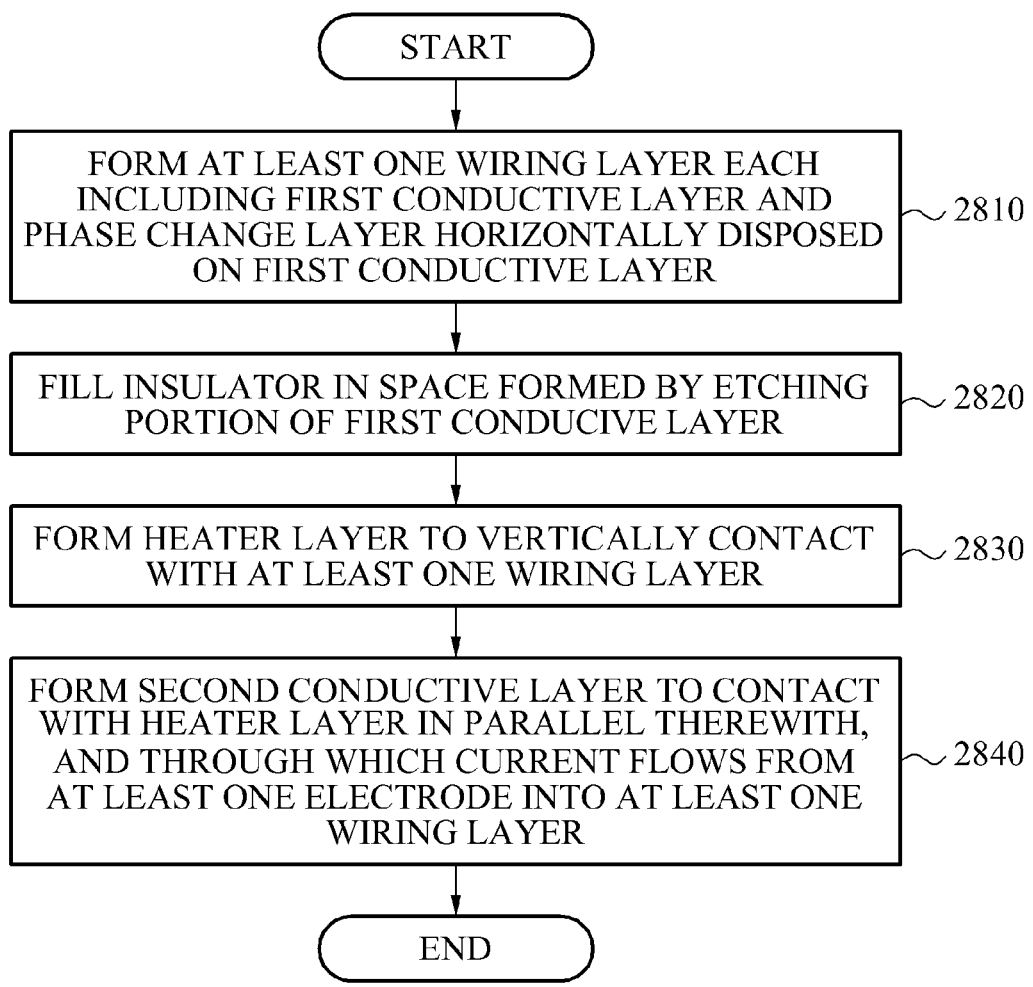
FIG. 28 is a flowchart illustrating a method of fabricating a phase change memory according to still another embodiment of the present invention.

FIG. 28 is a flowchart illustrating a method of fabricating a phase change memory according to still another embodiment of the present invention.

Referring to FIG. 28, in operation 2810, at least one wiring layer each including a first conductive layer and a phase change layer horizontally disposed on the first conductive layer may be formed. In operation 2820, an insulator may be filled in a space formed by etching a portion of the first conducive layer. Here, a multi-level bit/cell of the phase change memory may be adjusted by adjusting an etch rate of the first conductive layer.

The phase change layer may be made of a phase change material having a thickness less than a thickness of the first conductive layer, and may be horizontally disposed on the first conductive layer using an ALD method. The at least one wiring layer may be separated from each other by at least one insulating layer disposed between the at least one wiring layer.

In operation 2830, a heater layer may be formed to vertically contact with the at least one wiring layer. In operation 2840, a second conductive layer may be formed to contact with the heater layer in parallel therewith, and through which current flows from at least one electrode into the at least one wiring layer.

Also, at least lower electrode may be connected to the at least one wiring layer and an upper electrode may be connected to the second conductive layer.

According to an aspect, the phase change memory may be provided in a structure in which phase change materials are separated between cells and thereby formed on or below a horizontally formed conductive layer instead of vertically forming a phase change material, to for example, a resistive change layer within a contact hole. In such a multilayered structure, the phase change layers are separated by an interlayer insulating layer to thereby prevent inter-cell interference. Accordingly, the reliability for MLC may be secured According to an aspect, there may be provided a phase change memory in a 3D memory structure that may secure scalability in view of a horizontal dimension and thereby significantly decrease a number of vertically multilayered layers, and may reduce fabrication cost in view of process technology. Through vertical scaling, it is possible to secure a stable cell characteristic and stability in the 3D memory structure.

According to an aspect, a phase change memory may be provided in a structure of a 3D NAND flash memory device that may employ a thickness of a phase change material as a contact area and may dispose a phase change material on a conductive layer using an ALD method and thereby reduce a thickness of a thin film of a phase change layer and significantly decrease driving current density.

According to an aspect, the phase change memory may enhance a degree of integration by utilizing a 3D structure and may secure data reliability by a change in resistance at a data storage cross-point.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A phase change memory, comprising:
   at least one wiring layer each comprising a first conductive layer and a phase change layer horizontally disposed on the first conductive layer;
   a heater layer disposed to vertically contact with the at least one wiring layer;
   a second conductive layer disposed to contact with the heater layer in parallel therewith, and through which current flows from at least one electrode into the at least one wiring layer;
   an insulator formed in a space formed by etching a portion of the first conductive layer;
   at least one lower electrode connected to the at least one wiring layer; and
   an upper electrode connected to the second conductive layer,
   wherein the phase change layer is made of a phase change material and has a thickness less than a thickness of the first conductive layer.

2. The phase change memory of claim 1, wherein the phase change layer is horizontally disposed on the first conductive layer using an atomic layer deposition (ALD) method.

3. The phase change memory of claim 1, wherein the phase change layer has a phase change in a portion vertically contacting with the heater layer.

4. A method of fabricating a phase change memory, the method comprising:
   forming at least one wiring layer by horizontally disposing a phase change layer on a first conductive layer;
   forming a heater layer to vertically contact with the at least one wiring layer;
   forming a second conducive layer to contact with the heater layer in parallel therewith, and through which current flows from at least one electrode into the at least one wiring layer:
   forming at least one insulating layer between the at least one wiring layer;
   forming an insulator in a space formed by etching a portion of the first conductive layer;
   forming at least one lower electrode connected to the at least one wiring layer; and
   forming an upper electrode connected to the second conductive layer,
   wherein the phase change layer is made of a phase change material and has a thickness less than a thickness of the first conductive layer.

5. The method of claim 4, wherein the forming of the at least one wiring layer comprises horizontally disposing the phase change layer on the first conductive layer using an atomic layer deposition (ALD) method.

* * * * *